US008604955B2

(12) United States Patent
Oishi et al.

(10) Patent No.: US 8,604,955 B2
(45) Date of Patent: Dec. 10, 2013

(54) FILTER, AND TRANSMITTER AND RECEIVER HAVING THE SAME

(75) Inventors: Kazuaki Oishi, Kawasaki (JP); Shinji Yamaura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 155 days.

(21) Appl. No.: 13/005,069

(22) Filed: Jan. 12, 2011

(65) Prior Publication Data

US 2011/0170628 A1 Jul. 14, 2011

(30) Foreign Application Priority Data

Jan. 13, 2010 (JP) ................................ 2010-005007

(51) Int. Cl.
*H03M 1/00* (2006.01)

(52) U.S. Cl.
USPC ........... 341/142; 341/118; 341/120; 341/143; 341/144

(58) Field of Classification Search
USPC .................. 341/118, 120, 143, 144, 139, 142
See application file for complete search history.

(56) References Cited

U.S. PATENT DOCUMENTS

| | | | | |
|---|---|---|---|---|
| 5,892,473 A | * | 4/1999 | Shin | .............................. 341/150 |
| 6,114,981 A | * | 9/2000 | Nagata | ........................... 341/143 |
| 6,163,286 A | * | 12/2000 | Lee et al. | ....................... 341/143 |
| 6,204,789 B1 | * | 3/2001 | Nagata | ........................... 341/144 |
| 7,852,248 B1 | * | 12/2010 | Keramat et al. | ............... 341/143 |
| 2007/0207760 A1 | * | 9/2007 | Kavadias et al. | .............. 455/255 |
| 2009/0179696 A1 | * | 7/2009 | Watanabe et al. | ............. 327/553 |
| 2010/0297965 A1 | * | 11/2010 | Ryter | ............................. 455/108 |
| 2011/0025537 A1 | * | 2/2011 | Kim et al. | ..................... 341/143 |
| 2011/0068843 A1 | * | 3/2011 | Kodama | ........................ 327/238 |
| 2012/0200440 A1 | * | 8/2012 | Okada et al. | .................. 341/143 |

FOREIGN PATENT DOCUMENTS

| | | |
|---|---|---|
| JP | 2001-077694 A | 3/2001 |
| JP | 2003-273740 A | 9/2003 |
| JP | 2007-074442 A | 3/2007 |
| WO | WO 2009/014220 | * 11/2009 ............... H03H 7/21 |

OTHER PUBLICATIONS

Kozak, Mucahit et al., "Rigorous Analysis of Delta-Sigma Modulators for Fractional-N PLL Frequency Synthesis", IEE Transactions on Circuits and Systems, vol. 51, No. 6 Jun. 2004, pp. 1148-1162.

* cited by examiner

*Primary Examiner* — Linh Nguyen
(74) *Attorney, Agent, or Firm* — Fujitsu Patent Center

(57) ABSTRACT

In order to suppress the enlargement of the circuit layout area of an LSI together with the cost, even at the time when the variation width of the filter characteristic is narrow within a wide range, a filter varies an element value of at least one kind of elements (3), which determine a filter characteristic of the filter circuit, according to an output of the sigma-delta modulator (1), which sigma-delta modulates a digital code input (Code), according to an operation clock (CLK), or according to a signal through a decoder (4), which performs a code-conversion to an output of the sigma-delta modulator (1).

12 Claims, 26 Drawing Sheets

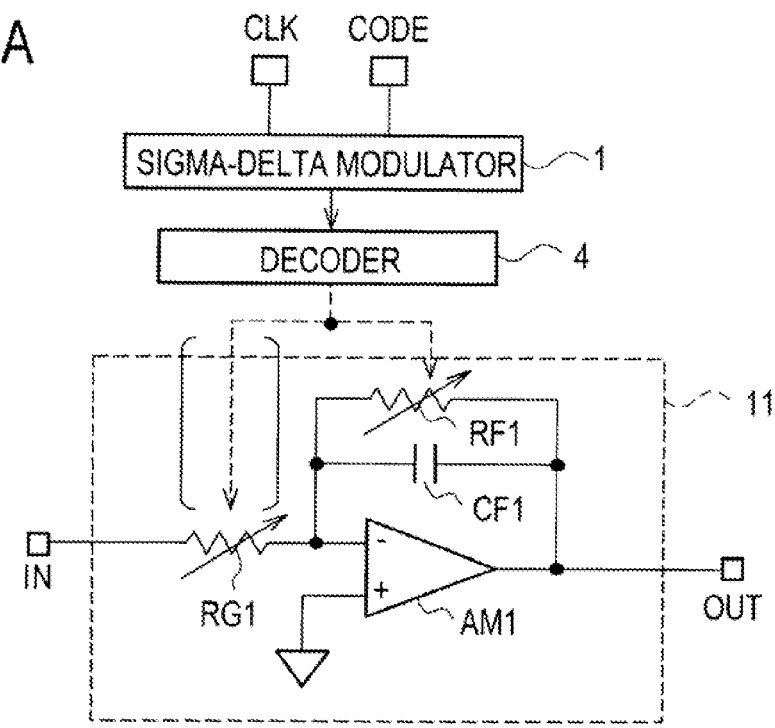
FIG.3A PRESENT EMBODIMENT (APPLICATION TO RC-LPF)
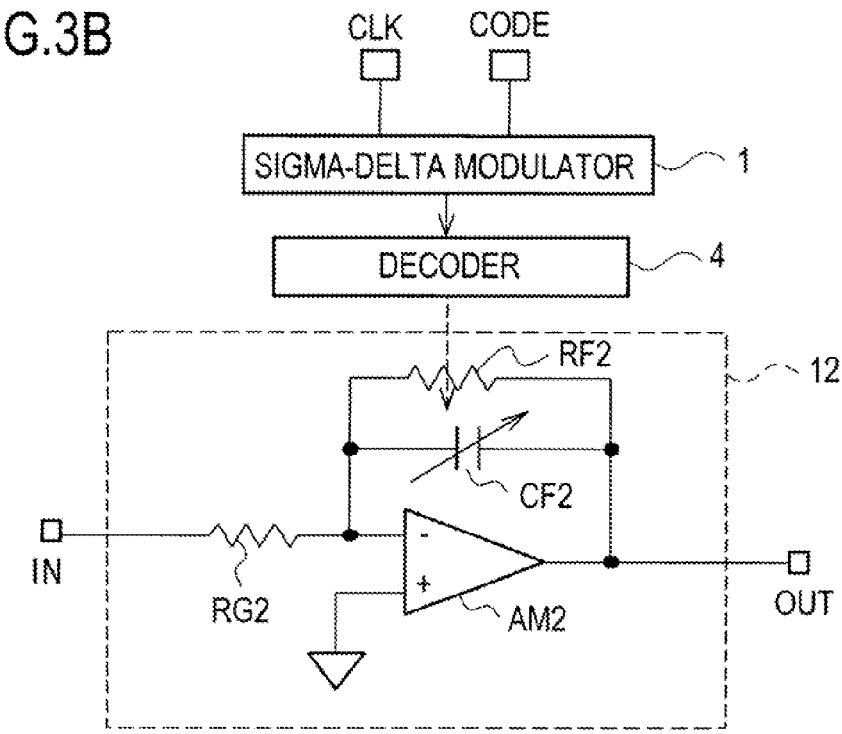
FIG.3B

FIG.4A PRESENT EMBODIMENT (APPLICATION TO RC-HPF)
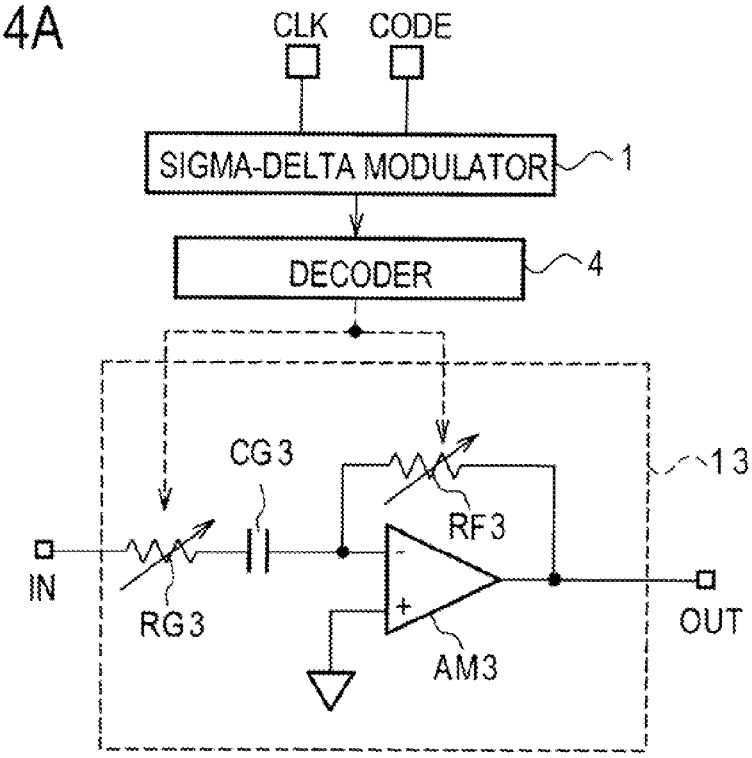
FIG.4B
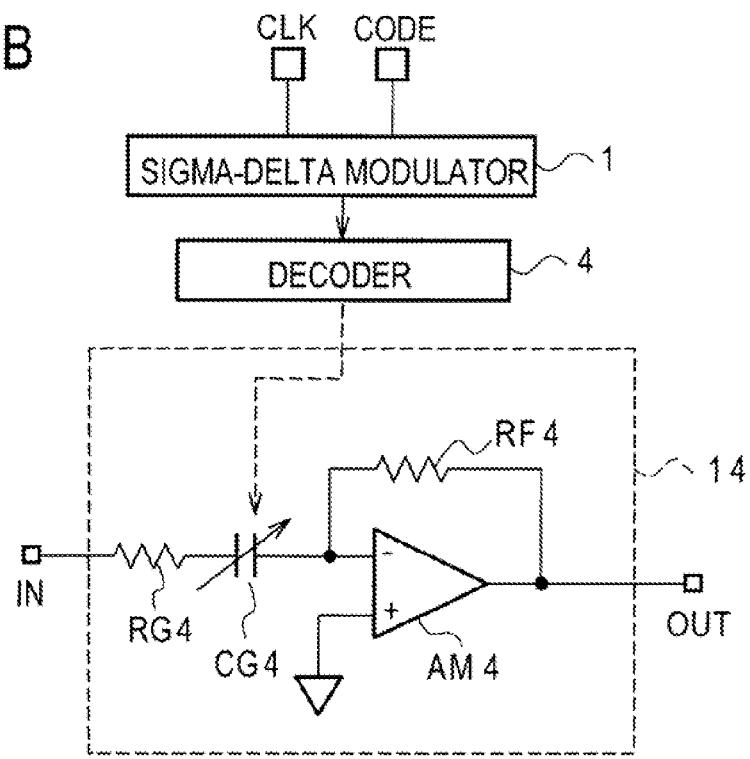

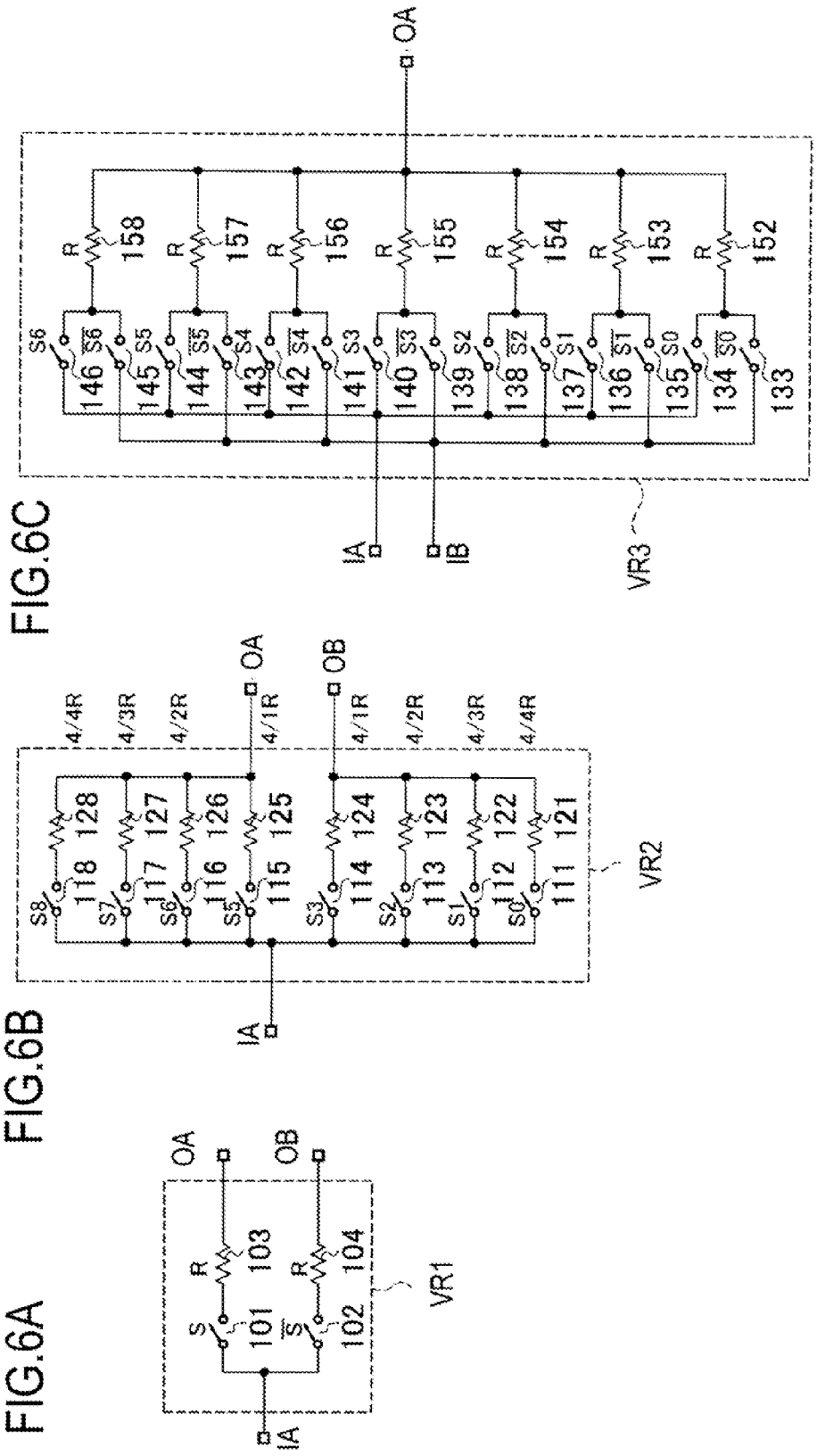

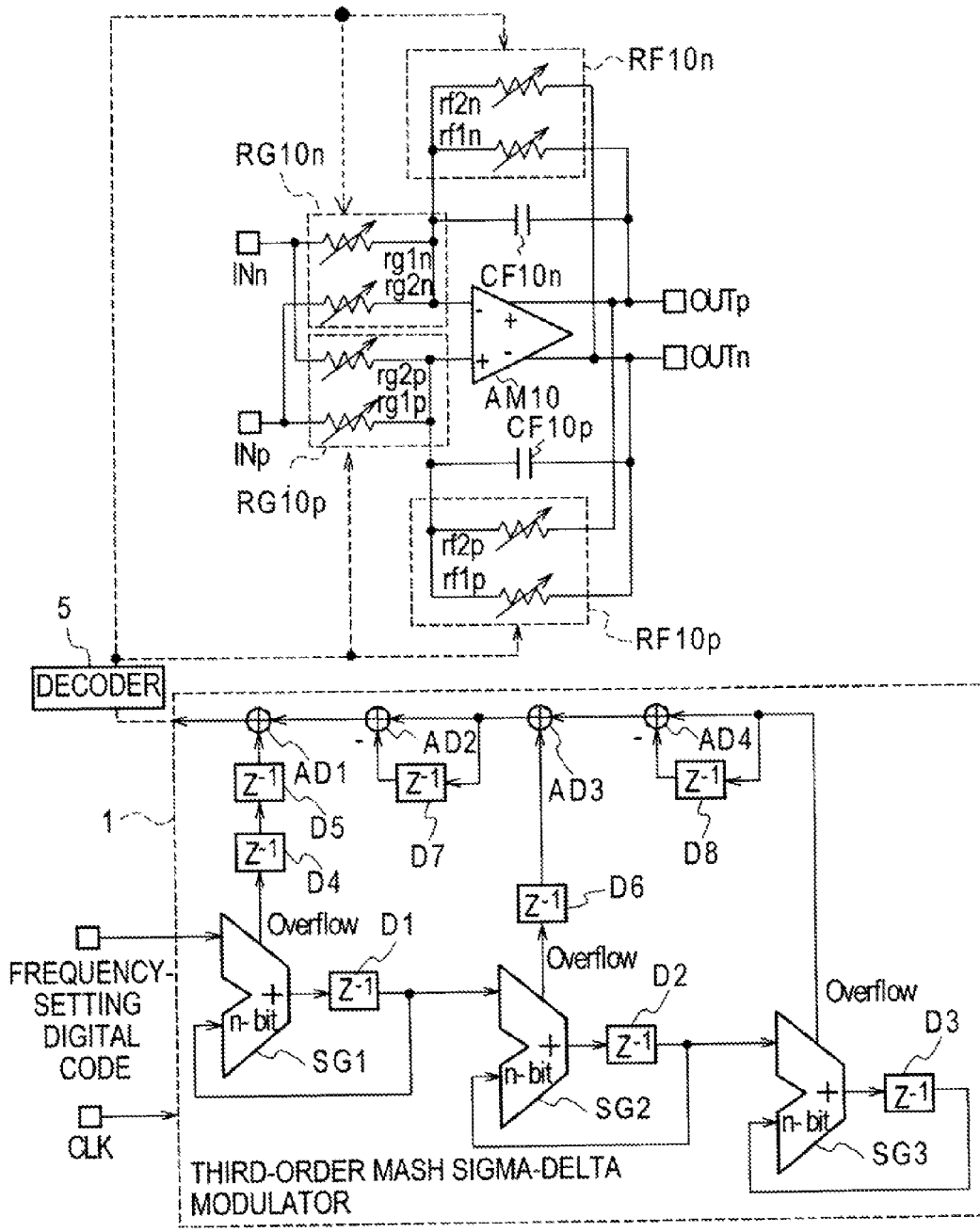

RESISTANCE VALUE SETTING ACCORDING TO OUTPUT OF
SIGMA-DELTA MODULATOR OF EMBODIMENT 1

| SIGMA-DELTA MODULATOR OUTPUT | DECODER OUTPUT S8 S7 S6 S5 S4 S3 S2 S1 S0 |
|---|---|
| 4  | 1 0 0 0 - 0 0 0 0 |
| 3  | 0 1 0 0 - 0 0 0 0 |
| 2  | 0 0 1 0 - 0 0 0 0 |
| 1  | 0 0 0 1 - 0 0 0 0 |
| 0  | 0 0 0 0 - 0 0 0 0 |
| -1 | 0 0 0 0 - 1 0 0 0 |
| -2 | 0 0 0 0 - 0 1 0 0 |
| -3 | 0 0 0 0 - 0 0 1 0 |

RESISTANCE VALUE SETTING
ACCORDING TO OUTPUT OF SIGMA-DELTA MODULATOR
OF EMBODIMENT 2

| SIGMA-DELTA MODULATOR OUTPUT | DECODER OUTPUT | | | | | | |
|---|---|---|---|---|---|---|---|
| | S6 | S5 | S4 | S3 | S2 | S1 | S0 |
| 4 | 1 | 1 | 1 | 1 | 1 | 1 | 1 |
| 3 | 0 | 1 | 1 | 1 | 1 | 1 | 1 |
| 2 | 0 | 0 | 1 | 1 | 1 | 1 | 1 |
| 1 | 0 | 0 | 0 | 1 | 1 | 1 | 1 |
| 0 | 0 | 0 | 0 | 0 | 1 | 1 | 1 |
| -1 | 0 | 0 | 0 | 0 | 0 | 1 | 1 |
| -2 | 0 | 0 | 0 | 0 | 0 | 0 | 1 |
| -3 | 0 | 0 | 0 | 0 | 0 | 0 | 0 |

FIG.13 CIRCUIT DIAGRAM OF FILTER CIRCUIT OF EMBODIMENT 3

FIG.15 CIRCUIT DIAGRAM OF FILTER CIRCUIT OF EMBODIMENT 4

EMBODIMENT 5
(APPLICATION TO RC BIQUAD LPF: No. 2)

FIG.17 CIRCUIT DIAGRAM OF FILTER CIRCUIT OF EMBODIMENT 5

CIRCUIT DIAGRAM OF VARIABLE CAPACITANCE MODULE

EMBODIMENT 7
(APPLICATION TO PASSIVE FILTER)

APPLICATION TO RADIO TRANSMISSION CIRCUIT

CHANNELS OF RADIO COMMUNICATION APPARATUS

RC-LPF(No. 1)

RC-LPF (No. 2)

FILTER, AND TRANSMITTER AND RECEIVER HAVING THE SAME

CROSS-REFERENCE TO RELATED APPLICATION

This application is based upon and claims the benefit of priority of the prior Japanese Patent Application No. 2010-5007, filed on Jan. 13, 2010, the entire contents of which are incorporated herein by reference.

FIELD

The embodiments discussed hereafter are related to a filter which switches a filter characteristic, and transmitter and receiver having the same.

BACKGROUND

As an example of an application of a filter, a radio-communication apparatus is discussed. For a radio-communication apparatus, both a high-speed data communication and a multi-terminal connection are required. Therefore, there can be a case, such that one terminal performs a high-speed communication by using a broad-band under a condition in which there are a small number of connection terminals, or a case, such that one terminal performs a data communication by using a narrow-band under a condition in which there are a large number of connection terminals.

In case of a low-pass filter, resistance of resistors or capacitance or capacitors in the low-pass filter is varied in order to vary the cut-off frequency. When the cut-off frequency is varied to be higher, a radio communication circuit can employ broader band. On the other hand, when the cut-off frequency is varied to be lower, a radio communication circuit can employ narrower band.

Also, a filter is applied to, not only a radio-communication apparatus, but also various kinds of apparatuses. As an example indirectly related to an embodiment illustrated hereinafter, a technology for switching a filter characteristic of a filter circuit to be applied to a DAC (Digital Analogue Converter), to which a Delta Sigma modulating method is used (refer to "Rigorous Analysis of Delta-Sigma Modulators for Fractional-N PLL Frequency Synthesis" (Transactions on Circuits and Systems), vol. 51, pp 1148-1162, June 2004), is illustrated.

With regard to the "D/A converting apparatus" described in Japanese patent laid-open publication No. 2003-273740, a technology for reducing noises caused by a limit cycle even at a time of zero input, by detecting a timing of the zero input signal and by switching the gain of LPH according thereto, is discussed.

Also, with regard to "a variable resistance circuit and D/A converter" described in Japanese patent laid-open publication No. 2001-77694, in relation to a D/A converter comprising soft mute function for detecting zero data, a technology for gradually reducing a feedback resistance at the output terminal of a LPF is discussed.

SUMMARY

As described above, in the related technologies, for varying a filter characteristic of a filter circuit, elements (a resistor, a capacitor, or the like) which determine the filter characteristic are made to be varied. For enabling the variability, since a large number of unit elements are required to be arranged, there is a concern of enlargement of the area and increase of the cost, especially in case that a variation width is narrow but a variation range is wide.

For example, as for a radio-communication apparatus such as a receiver, transmitter, and the like, especially in case that it is required to switch the cut-off frequency of a filter circuit by a narrow width within a wide range, there is a problem such that the scale of the LSI is enlarged, and thus the cost increases.

Embodiments which will be discussed hereinafter, with regard to the above described problems, are to provide a filter which can suppress the enlargement of the circuit and, at the same time, suppress the cost, even at the time when the variation width of the filter characteristic is narrow within a wide range.

According to one aspect of the embodiment, a filter comprises a sigma-delta modulator which sigma-delta modulates a digital code input; and a filter circuit, wherein an element value of at least one kind of elements, which determine a filter characteristic of the filter circuit, is varied, according to an output of the sigma-delta modulator, or according to a converted signal through a converter which performs a code-conversion to the output of the sigma-delta modulator.

By the above aspect even in case that the variation width of the filter characteristic is narrow and in a wide range, it is enabled to have a small number of unit elements to be varied, which determine the filter characteristic, thus to suppress the enlargement of the circuit layout area of an LSI and, together with this, the cost.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3a-3b illustrate examples of an RC-LPF circuit.

FIG. 4a-4b illustrate examples of an RC-HPF circuit.

FIG. 6a-6c illustrate examples of a fully-differential RC active filter circuit.

FIG. 7 illustrates an example of a fully-differential RC-LPF circuit.

FIG. 28a-28c illustrate examples of a related RC-LPF circuit.

DESCRIPTION OF EMBODIMENTS

Figure 23:
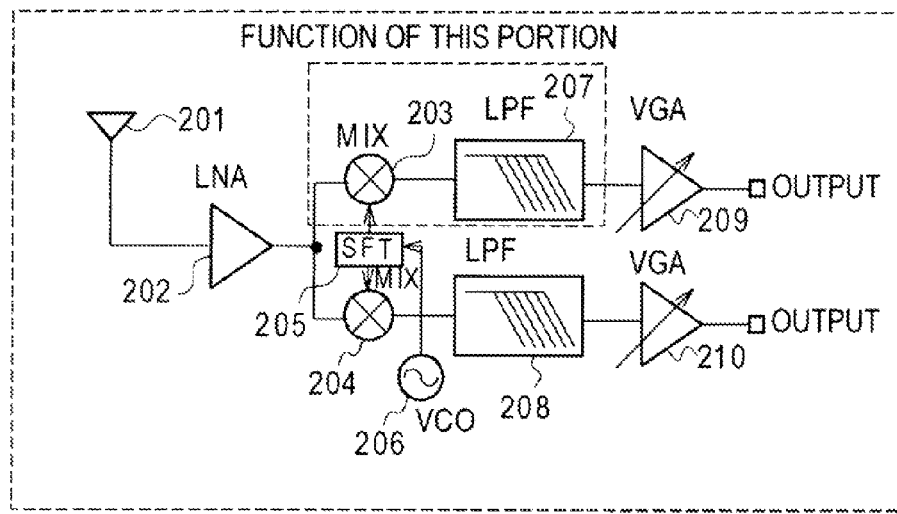
FIG. 23 illustrates an example of a radio-communication receiver.
Figure 26A:
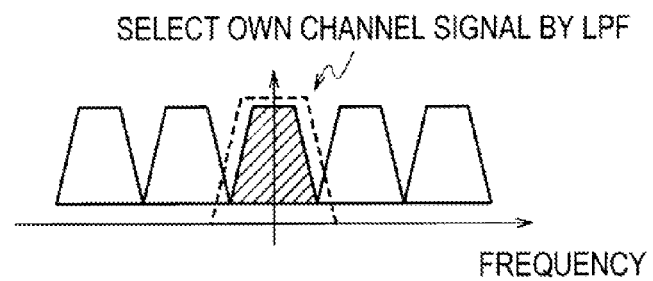
FIG. 26 illustrates an example of a channel selection of a radio transmitter.
Figure 26B:
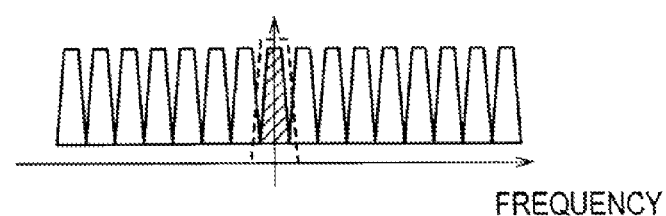

FIG. 23 illustrates a radio-communication circuit. Low-pass filters (LPF's) 207 and 208 which select channels of baseband signals converted by mixers 203 and 204 need to vary the cut-off frequencies. That is, under a condition, in which there are a small number of connection terminals, since one terminal uses a broad band, a cut-off frequency is made to be relatively high so that a broader-band can be employed, as illustrated in FIG. 26A. On the other hand, under a condition, in which there are a large number of connection terminals, since one terminal uses a narrow-band, a cut-off frequency is made to be relatively low so that a narrower-band can be employed, as illustrated in FIG. 26b.

Here, a case is discussed, in which the LPF's 207 and 208 are configured with active filters each of which has an operational amplifier, resistors, and capacitors, and is built-in an LSI. As a method for varying a cut-off frequency of a filter circuit, it can be possible to vary an element which determines the time constant of the filter circuit, that is, the resistors or the capacitor.

Figure 27A:
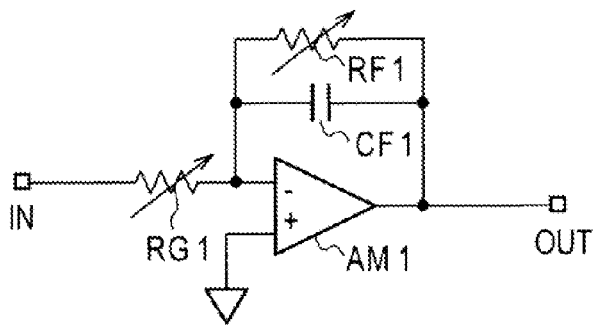
FIG. 27a-27c illustrate examples of a related RC-LPF circuit.

For example, in an RC-LPF circuit configuration illustrated in FIG. 27A, since the cut-off frequency is proportional to 1/(RF1*CF1), the cut-off frequency can be varied by varying the value of the resistance RF1. Further, in FIG. 27A, since the gain of the filter circuit is varied in case that the resistance RF1 is varied, the configuration is made to be such that the value of the resistance RG1 can be varied as well, for maintaining the gain constant.

Figure 27B:
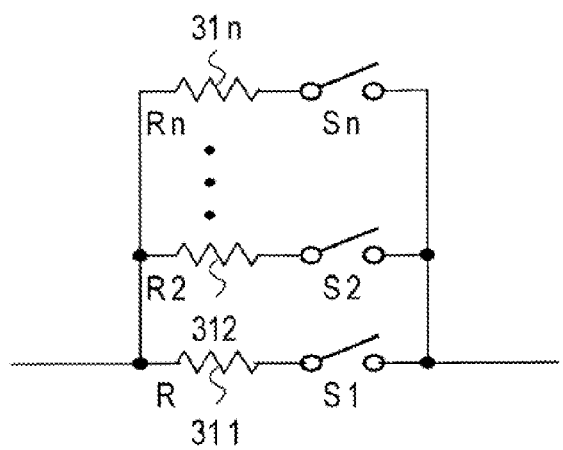
Figure 27C:
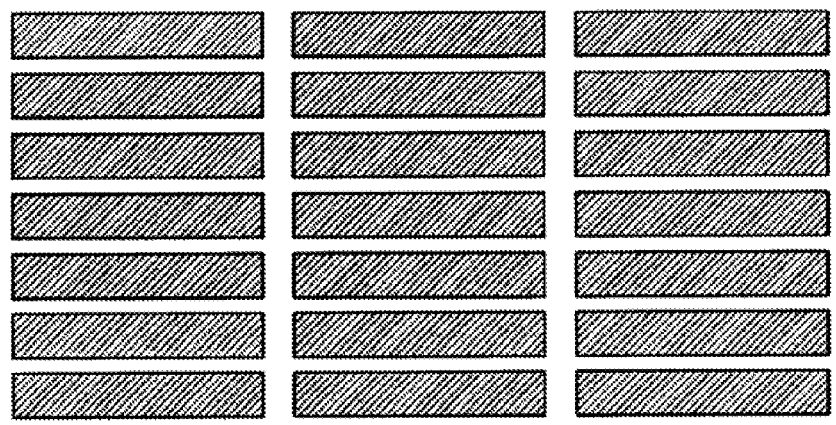

As a configuration in which the resistor RF1 is made to be a variable resistor, there is a configuration, for example, as illustrated in FIG. 27B, in which resistors 311-31n having respectively resistance values R-Rn are connected in parallel, and each of switches S1-Sn is serially connected to each of the resistors 311-31n. In an LSI, for example, as illustrated by schematic layout diagram of 27C, a large number of unit resistors are arranged, and whether they are connected or disconnected is selected by on/off of the switches S1-Sn, thus the variable resistance is enabled.

Figures 28A, 28B, 28C:
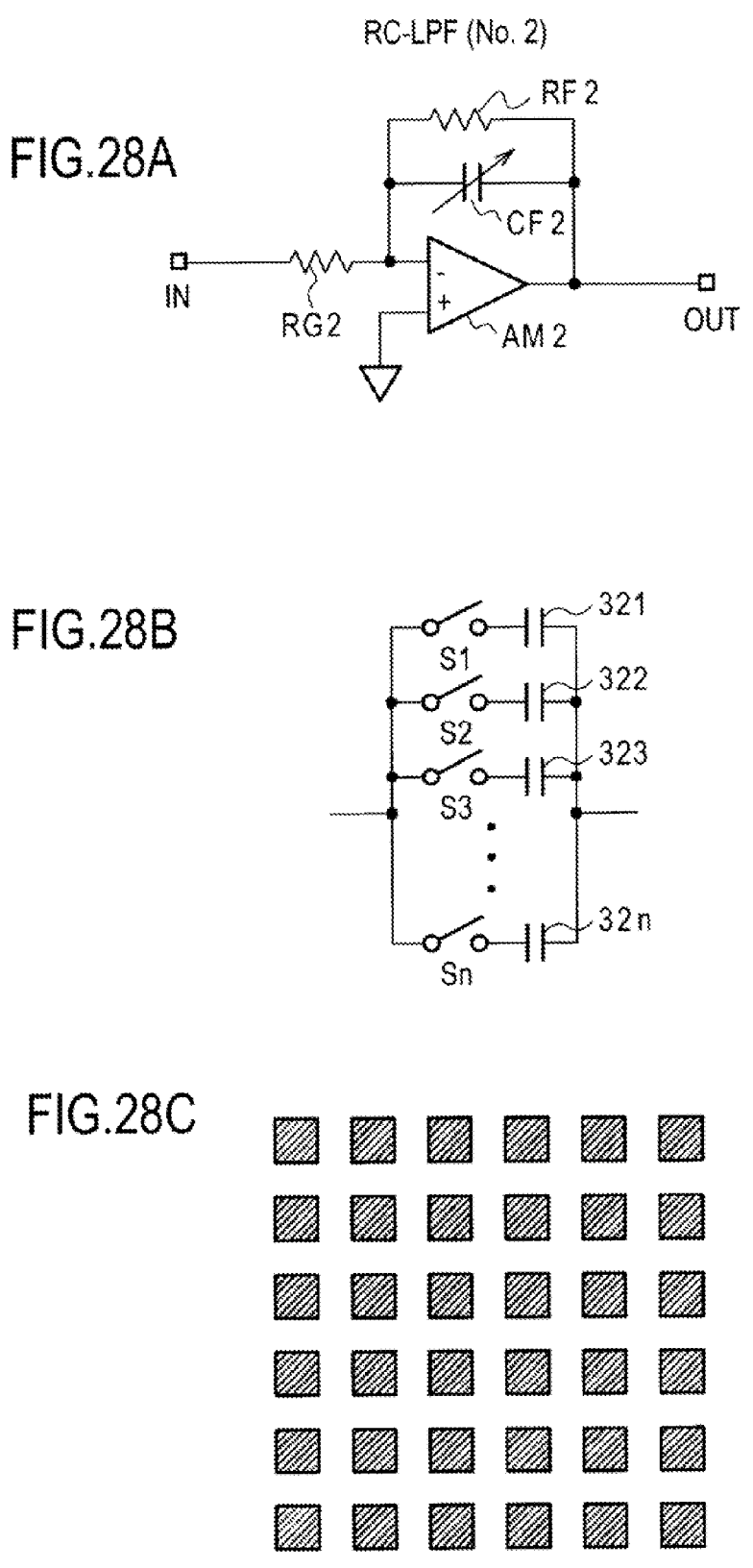

Also in an RC-LPF circuit configuration illustrated in FIG. 28A, since a cut-off frequency is proportional to 1/(RF2*CF2), the cut-off frequency can be varied by varying the value of the capacitor CF2.

As a configuration in which the capacitor CF2 is made to be a variable capacitance, there is a configuration, for example, as illustrated in FIG. 28B, in which unit capacitors 321-32n are connected in parallel, and each of switches S1-Sn is serially connected to each of the capacitors 321-32n. In an LSI, for example, as illustrated in a schematic layout diagram of FIG. 28C, a large number of unit capacitors are arranged, and whether they are connected or disconnected is selected by on/off of the switches S1-Sn, thus the variable capacitance is enabled.

By referring to FIG. 1 to FIG. 6, a basic configuration of a filter circuit of one embodiment and various basic configurations in which the embodiment is applied to an RC active filter are explained.

Figure 1:
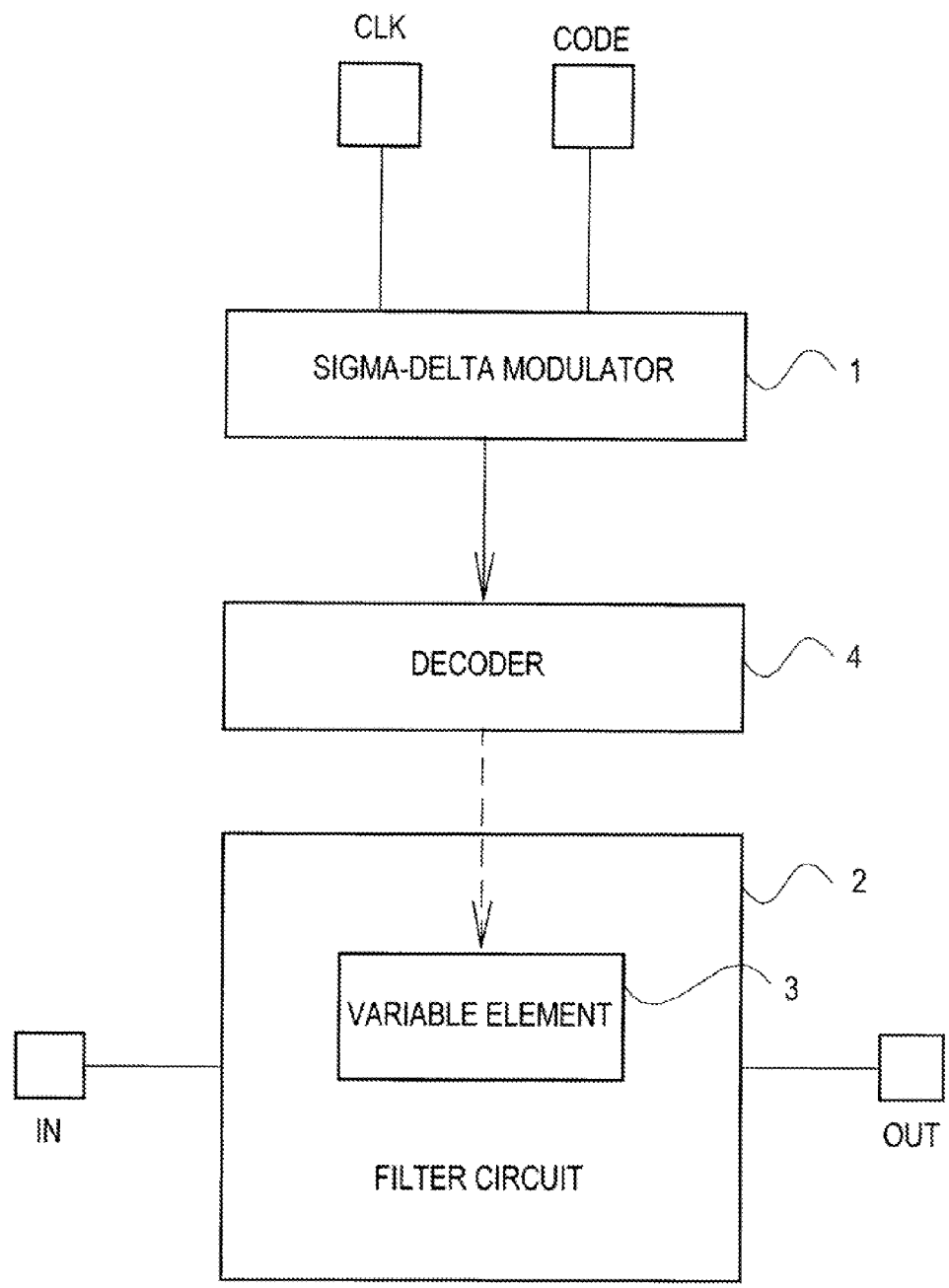
FIG. 1 illustrates an example of a filter circuit.

A filter circuit of the present embodiment illustrated in FIG. 1 comprises a sigma-delta modulator 1, a decoder (a converter) 4, and a filter circuit 2. Here, the sigma-delta modulator 1 is a modulator which sigma-delta modulates a digital code input CODE, in synchronous to an operation clock CLK.

Also, the filter circuit 2 can be any of a low-pass filter (LPF) which filters a signal of a low frequency, a high-pass filter (HPF) which filters a signal of a high frequency, or a band-pass filter (BPF) which filters a signal of an intermediate frequency. And the filter circuit 2 can be any type of a passive filter, an active filter and the like, except for a digital filter.

The filter circuit of the present embodiment varies an element value of at least one kind of an element (a variable element) 3, which determines a filter characteristic of the filter circuit 2, according either to an output of the sigma-delta modulator 1, or a signal through the decoder 4, which converts the output of the sigma-delta modulator 1 into a code for varying the variable element 3.

Herewith, the filter characteristic is a time constant (the inverse number of a cut-off frequency) or a gain. Also, the element 3 which determines the filter characteristic is different depend on the type of the filter circuit, such as a resistor, a capacitor, a mutual conductance. And the element 3 is a variable element (a variable resistor, a variable capacitor, or a variable mutual conductance).

The variable element 3 is configured, such that unit elements are connected in parallel and the element value is varied by controlling on/off of switches, each of which is serially connected to the unit elements. As a control signal for performing an on/off-control thereof, the output of the sigma-delta modulator 1, or the signal through the decoder 4, which converts into a code the output of the sigma-delta modulator 1, is used. Here, either of the output of the sigma-delta modulator 1 or the signal through the decoder 4, which converts into a code the output of the sigma-delta modulator 1, can be used, however, in the following explanation of embodiments, a configuration with the decoder 4 is illustrated as an example.

Figure 2A:
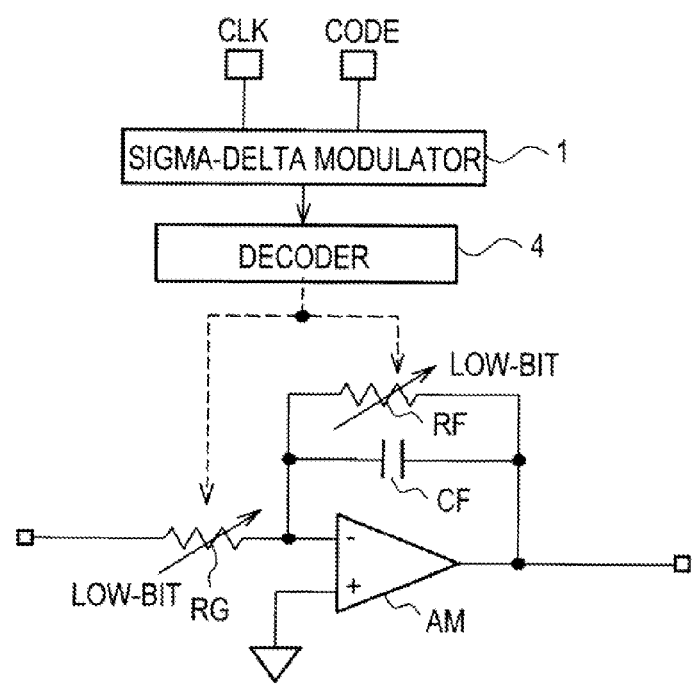
FIG. 2a, 2b illustrate examples of a basic operation of the filter circuit.

For example, in case that the present embodiment is applied to an RC active-LPF circuit, a circuit configuration is illustrated in FIG. 2A. In the circuit example of FIG. 2A, for switching the cut-off frequency of the RC active-LPF circuit, a feedback resistor RF and an input resistor RG of an operational amplifier AM are made to be varied.

Figure 2B:
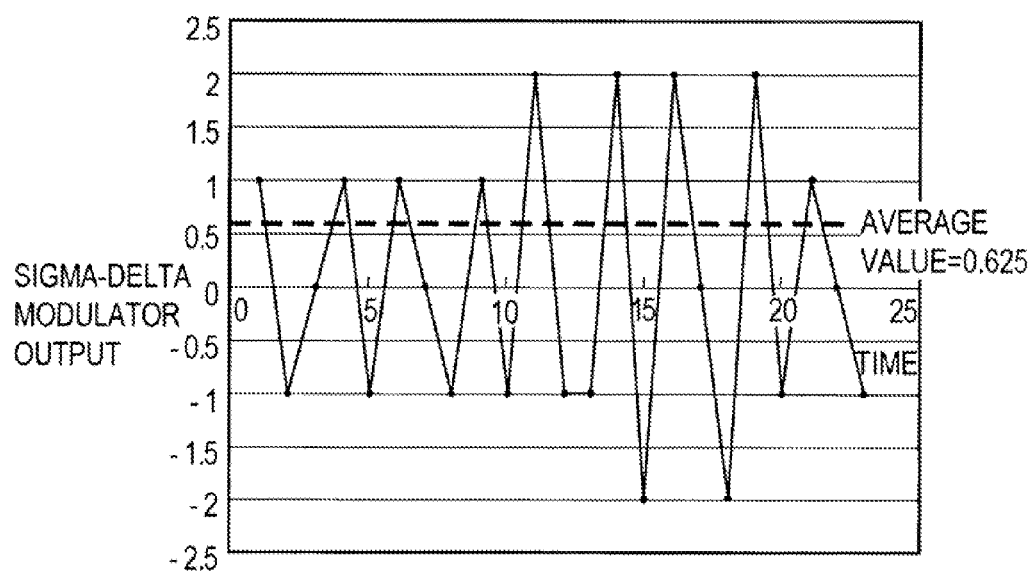

The sigma-delta modulator 1 sigma-delta modulates, according to the operation clock CLK, n-bit (n is a positive integer) digital code input CODE (value of H), and outputs, for example, signals having the time transition as illustrated in FIG. 2B. In this manner, the output of the sigma-delta modulator 1 is momentarily low-bit (low resolution; five values {2, 1, 0, −1, −2} in FIG. 2B), while for relatively a long period (=2*n), the average value (0.625 in FIG. 2b) is a value (=H/2n) corresponding to a value of digital code input CODE. That is, according to the setting of the value H of the digital code input CODE, the average value of the output for a long period can be varied by $2^n$-steps between 0 and 1, and the average value for a long period is high resolution (high-bit), even when the output of the sigma-delta modulator 1 is momentarily low-bit (low resolution).

Here, since the output of the sigma-delta modulator 1 varies as illustrated in FIG. 2B according to a frequency of the operational clock CLK, an influence of a generated noise to the filter circuit may be a problem. However, since a sigma-delta conversion method has an advantageous effect of so called noise shaping in which the noise is shifted to a high frequency range, the amount of noise becomes small in relatively low frequency-range, and large in relatively high-frequency range. Therefore, by setting the frequency of the operational clock CLK at higher order than that of the cut-off frequency, an influence of the noise to the LPF or to the BPF can be reduced.

According to an output signal of the decoder 4, which is an output of the sigma-delta modulator 1 through the code-conversion by the decoder 4, on/off-controls of the unit elements constituting the variable resistors RF and RG are performed, and it is enabled to switch the cut-off frequency in $2^n$-steps by the n-bit digital code input CODE.

Here, in case of varying both of the feedback resistor RF and the input resistor RG by the same on/off-control signal, the gain, being proportional to RF/RG, is constant. Also, for switching the cut-off frequency together with the gain, it may be required to perform an on/off-control of each of the unit elements constituting the variable resistors RF and RG, according to the output signals of the decoder 4, which are code-converted from separate output signals of sigma-delta modulator 1.

As the above, by the present embodiment, even in case that the variation width of the filter characteristic (the cut-off frequency) is narrow and in a wide range, it is enabled to reduce a number of unit elements to be varied, which determines the filter characteristic, thus to suppress the enlargement of the circuit layout area of an LSI and, together with this, the cost.

Next, more specifically, a basic configuration in which the present embodiment is applied to an RC active filter (RC active-LPF circuit) is explained. In FIGS. 3A and 3B, an RC active-LPF circuit, to which the present embodiment is applied, is illustrated.

The filter circuit illustrated in FIG. 3A comprises the sigma-delta modulator 1, the decoder 4, and an RC active-LPF circuit 11. The RC active-LPF circuit 11 includes an operational amplifier AM1, an input resistor RG1, a feedback resistor RF1, and a feedback capacitor CF1. In the configuration of this filter circuit, the cut-off frequency is proportional to 1/(RF1*CF1), and the gain is RF1/RG1. Here, the input resistor RG1 and the feedback resistor RF1 are made to be variable resistors, and, according to the output signal of the decoder 4, which performs a code-conversion to the output of the sigma-delta modulator 1, the on/off-controls of the unit resistors constituting the variable resistors are performed. By means of this, it is enabled to switch multiple steps of the cut-off frequency by the low-bit digital code output by the decoder 4 or the modulator 1, and, together with this, to maintain the gain constant.

Also, the filter circuit illustrated in FIG. 3B comprises the sigma-delta modulator 1, the decoder 4, and an RC active-LPF circuit 12. The RC active-LPF circuit 12 comprises an operational amplifier AM2, an input resistor RG2, a feedback resistor RF2, and a feedback capacitor CF2. Here, the feedback capacitor CF2 is made to be a variable capacitor, and, according to the output signal of the decoder 4, the on/off-control of the unit element constituting the variable capacitor is performed. By means of this, it is enabled to switch multiple steps of the cut-off frequency by the low bit digital code output by the decoder 4 or the modulator 1.

Next, a basic configuration, in which the present embodiment is applied to an RC active filter (an RC active-HPF circuit), is explained. In FIGS. 4A and 4B, an RC active-HPF circuit, to which the present embodiment is applied, is illustrated.

The filter circuit illustrated in FIG. 4A comprises the sigma-delta modulator 1, the decoder 4, and an RC active-HPF circuit 13. The RC active-HPF circuit 13 includes an operational amplifier AM3, an input resistor RG3, a feedback resistor RF3, and an input capacitor CG3. In the configuration of this filter circuit, the cut-off frequency is proportional to 1/(RF3*CG3), and the gain is RF3/RG3. Here, the input resistor RG3 and the feedback resistor RF3 are made to be variable resistors, and, according to the output signal of the decoder 4, which performs a code-conversion to the sigma-delta modulator 1, the on/off-control of the unit resistors constituting the variable resistors are performed. By means of this, it is enabled to switch multiple steps of the cut-off frequency by a low-bit digital code, ant together with this, to maintain the gain constant.

Also, the filter circuit illustrated in FIG. 4B comprises the sigma-delta modulator 1, the decoder 4, and an RC active-HPF circuit 14. The RC active-HPF circuit 14 comprises an operational amplifier AM4, an input resistor RG4, a feedback resistor RF4, and an input capacitor CG4. Here, the input capacitor CG4 is made to be a variable capacitor, and, according to the output signal of the decoder 4, the on/off-control of the unit capacitor constituting the variable capacitor is performed. By means of this, it is enabled to switch, by a low bit digital code, multiple steps of the cut-off frequency.

Next, on the basis of the above explained basic configuration of filter circuits, and on the basis of the various basic configurations, in which the present embodiment is applied to an RC active filter, explanations of embodiments are carried out. In the following, with regard to various embodiments of the application to the RC active filter, embodiments 1 to 6 are explained in details in order by referencing figures. Also, the application of the present embodiment to a passive filter is explained in embodiment 7. Further, with regard to the application of the present embodiment to a receiver and a transmitter, embodiments 8 to 10 are explained in order in details by referencing figures.

[Embodiment 1]

Figure 5:
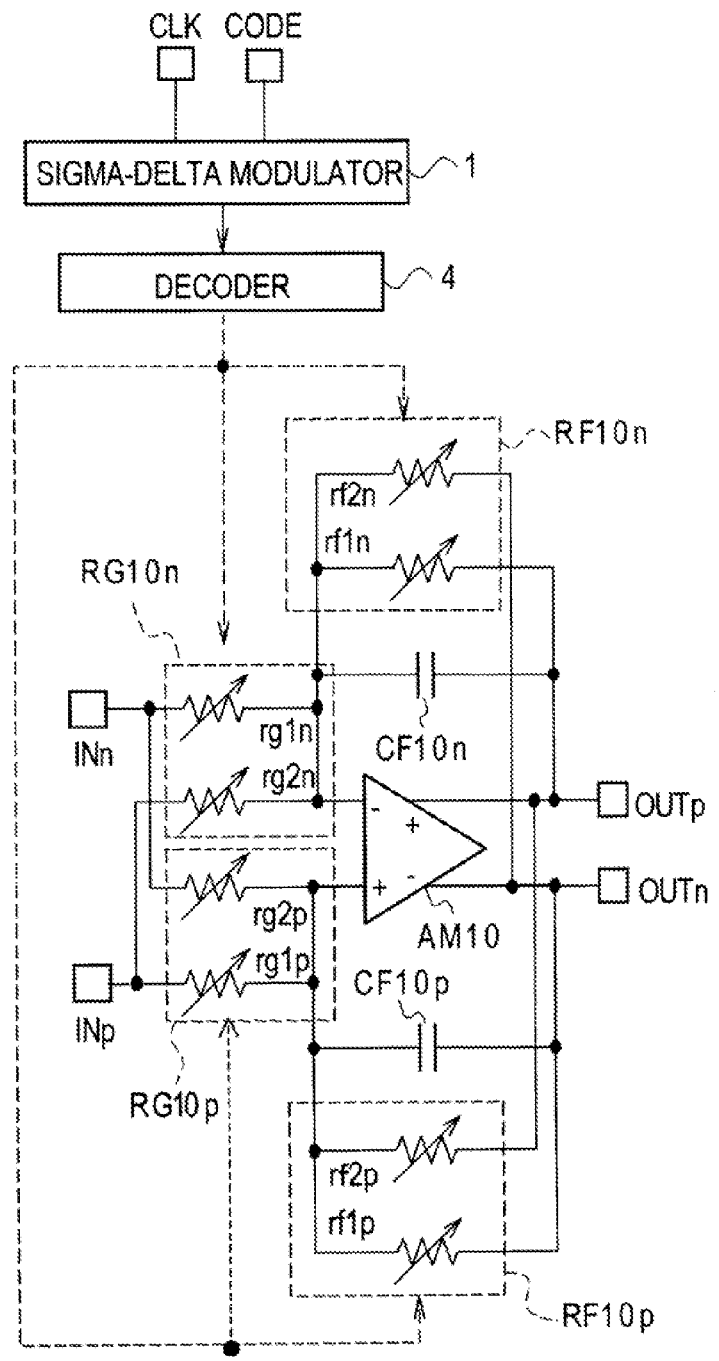
FIG. 5 illustrates examples of a fully-differential RC-LPF circuit.

First, by referring to FIG. 5 and FIG. 6, a basic configuration, in which the present embodiment is applied to a fully-differential RC active filter (a fully-differential RC active-LPF circuit), is explained. In FIG. 5, a diagram of a fully-differential RC active-LPF circuit to which the present embodiment is applied, is illustrated, and in each of FIGS. 6a, 6b, and 6c, circuit diagram of a variable resistance module is illustrated.

The filter circuit illustrated in FIG. 5 comprises the sigma-delta modulator 1, the decoder 4, and a fully-differential RC active-LPF circuit. The fully-differential RC active-LPF circuit includes a fully-differential operational amplifier AM10, input resistors RG10p and RG10n, feedback resistors RF10p and RF10n, and feedback capacitors CF10p and CF10n. Here, the input resistors RG10p and RG10n, and feedback resistors RF10p and RF10n are variable resistors. Also, an each pair, to be more specific, the pair of the input resistors RG10p and RG10n, and the pair of feedback resistors RF10p and RF10n, have the same circuit configuration.

Also, the feedback capacitor CF10p is connected between the positive-polarity input terminal and the negative-polarity output terminal of the fully-differential operational amplifier AM10, and the feedback capacitor CF10n is connected between the negative-polarity input terminal and the positive-polarity output terminal of the fully-differential operational amplifier AM10.

Also, a resistor rg1p between a first terminal and the same-polarity second terminal of the input resistance RG10p is connected between the positive input terminal of the fully-differential operational amplifier AM10 and the positive input terminal INp of the filter circuit. Also, a resistor rg2p between the first terminal and the reverse-polarity second terminal of the input resistor RG10P is connected between the positive input terminal of the fully-differential amplifier AM10 and the negative input terminal INn of the filter circuit. Also, a resistor rg1n between a first terminal and the same-polarity second terminal of the input resistor RG10n is connected to the negative input terminal of the fully-differential operational amplifier AM10 and the negative input terminal INn of the filter circuit. Further, a resistor rg2n between the first terminal and the reverse-polarity second terminal of the input resistor RG10n is connected to the negative input terminal of the fully-differential operational amplifier AM10 and the positive input terminal of INp of the filter circuit.

Also, a resistor rf1p between a first terminal and the same-polarity second terminal of the feedback resistor RF10p is connected between the positive input terminal and the negative output terminal of the fully-differential operational amplifier AM10. Also, a resistor rf2p between the first terminal and the reverse-polarity second terminal of the feedback resistor RF10p is connected between the positive input terminal and the positive output terminal of the fully-differential amplifier AM10. Also, a resistor rf1n between a first terminal and a second terminal of the same-polarity of the feedback resistor RF10n is connected to the negative input terminal and the positive output terminal of the fully-differential amplifier AM10. Further, a resistor rf2n between the first terminal and the reverse-polarity second terminal of the feedback resistor RF10n is connected between the negative input terminal and the negative output terminal of the fully-differential amplifier AM10. In the configuration of this filter circuit, the cut-off frequency is proportional to $1/(RF10x*CF10x)$, for x=p or x=n, and the gain is RF10x/RG10x. Here, the input resistors RG10p and RG10n and the feedback resistors RF10p and RF10n are made to be variable resistors, and, according to the output signal of the decoder 4, which performs a code-conversion to the output of the sigma-delta modulator 1, the on/off-controls of the unit resistors constituting the variable resistor are performed. By means of this, it is enabled to switch multiple steps of the cut-off frequencies by a low-bit digital code, and, together with this, to maintain the gain constant.

Also, a circuit configuration of a variable resistance module, which is used as the variable resistor of the present embodiment, is illustrated in FIG. 6. Here, in the following, a first, a second, and a third circuit configuration of the variable resistance module are discussed as examples, and the focus of the present embodiment is not limited to these examples. Further, in the embodiment 1, the first variable resistance module (FIG. 6A) and the second variable resistance module (FIG. 6B) are applicable, and the third variable resistance module (FIG. 6C) is explained later.

The first variable resistance module, as illustrated in FIG. 6A, comprises a first terminal IA, a same-polarity second terminal OA having the same-polarity, a reverse-polarity second terminal OB having the reverse-polarity, and a pair of internal resistors 103 and 104. One terminal of each of the internal resistors 103 and 104 is connected to the first terminal IA via switches 101 and 102, and the other terminal of the internal resistor 103, on one-side, is connected to the reverse-polarity second terminal OA, and the other terminal of the internal resistor 104, on the other-side, is connected to the reverse-polarity second terminal OB. Also, an on/off-control signal of the switch 101, which is connected to the internal resistor 103, on one-side, is an inverted signal of an on/off-control signal of the switch 102, which is connected to the internal resistor 104, on the other-side.

Also, the second variable resistance module, as illustrated in FIG. 6A, comprises a first terminal IA, a same-polarity second terminal OA having the same-polarity as the first terminal IA, a reverse-polarity terminal OB having the reverse-polarity, and a pair of internal variable resistor groups, each of which has the same number (four) of internal resistors, that are, internal resistors 121-124 and internal resistors 125-128. In each of the variable resistor groups, one terminal of each of the internal resistors 121-128 is connected via each of switches 111-118 to the first terminal IA. Also, in one of the variable resistor groups, the other terminal of each of the variable resistors 125-128 is connected to the second same-polarity terminal OA, and the other terminal of each of the variable resistors 121-124 in the other variable resistor group is connected to the second reverse-polarity terminal OB. Also, on/off-control signals of switches 115-118, which are connected to one of the internal resistor groups, are inverted signals of the on/off-control signals of switches 111-114, which are connected to the other internal resistor group.

Figures 8A, 8B:
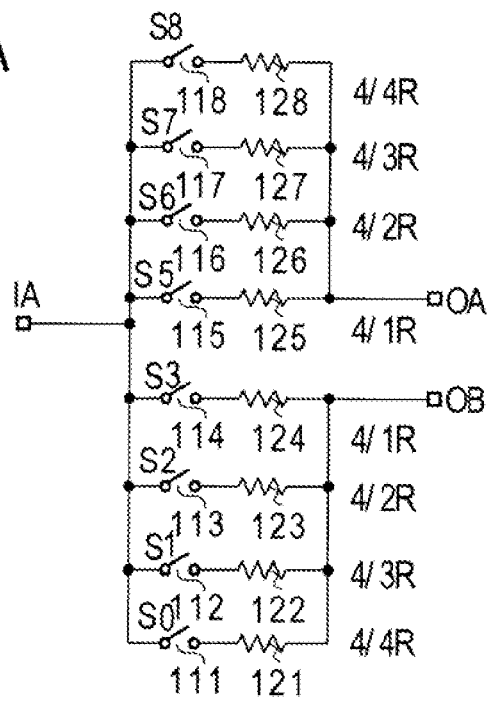
FIG. 8a, 8b illustrate examples of resistance value setting of a variable resistance module.

Next, by referring to FIG. 7 and FIG. 8, various configurations, in which the present embodiment is applied to a fully-differential RC active filter (fully-differential RC active-LPF circuit), are explained. In FIG. 7, a specific circuit diagram of a fully-differential RC active-LPF circuit, to which the present embodiment is applied, is illustrated. Also, in FIG. 8A, a circuit diagram of the second variable resistance module, which is used, is illustrated, and, in FIG. 8B, a setting of resistance values corresponding to the sigma-delta modulator 1 in the variable resistance module is illustrated.

The filter circuit illustrated in FIG. 7 comprises the sigma-delta modulator 1, a decoder 5, and a fully-differential RC active-LPF circuit. The fully-differential RC active-LPF circuit comprises the fully-differential operational amplifier AM10, input resistors RG10p and RG10n, feedback resistors RF10p and RF10n, and feedback capacitors CF10p and CF10n, and has the same circuit configuration as illustrated in FIG. 5, In this embodiment, as the sigma-delta modulator 1, a third-order MASH sigma-delta modulator is used. The third-order MASH delta-sigma modulator 1 comprises a first-stage integrator having an adder SG1 and a delay circuit D1 for accumulatively adding the n-bit digital code input CODE, a second-stage integrator having an adder SG2 and a delay circuit D2 for accumulatively adding outputs of the first-stage integrator, and a third-stage integrator having an adder SG3 and a delay circuit D3 for accumulatively adding outputs of the second-stage integrator. These first-stage integrator, the second-stage integrator, and the third-stage integrator control the sigma function of the sigma-delta modulation.

Also the third-order MASH sigma-delta modulator 1 comprises delay circuits D4-D8 and adders AD1-AD4 so that differentiators each differentiates each overflow signal of the second, and the third integrators are configured. The differentiators control the delta function of the delta-sigma modulation. Here, in the adders AD1-AD4, minus sign "−" are used only for inputs to be handled as negative inputs, and other inputs are handled as a positive input.

Figure 9:
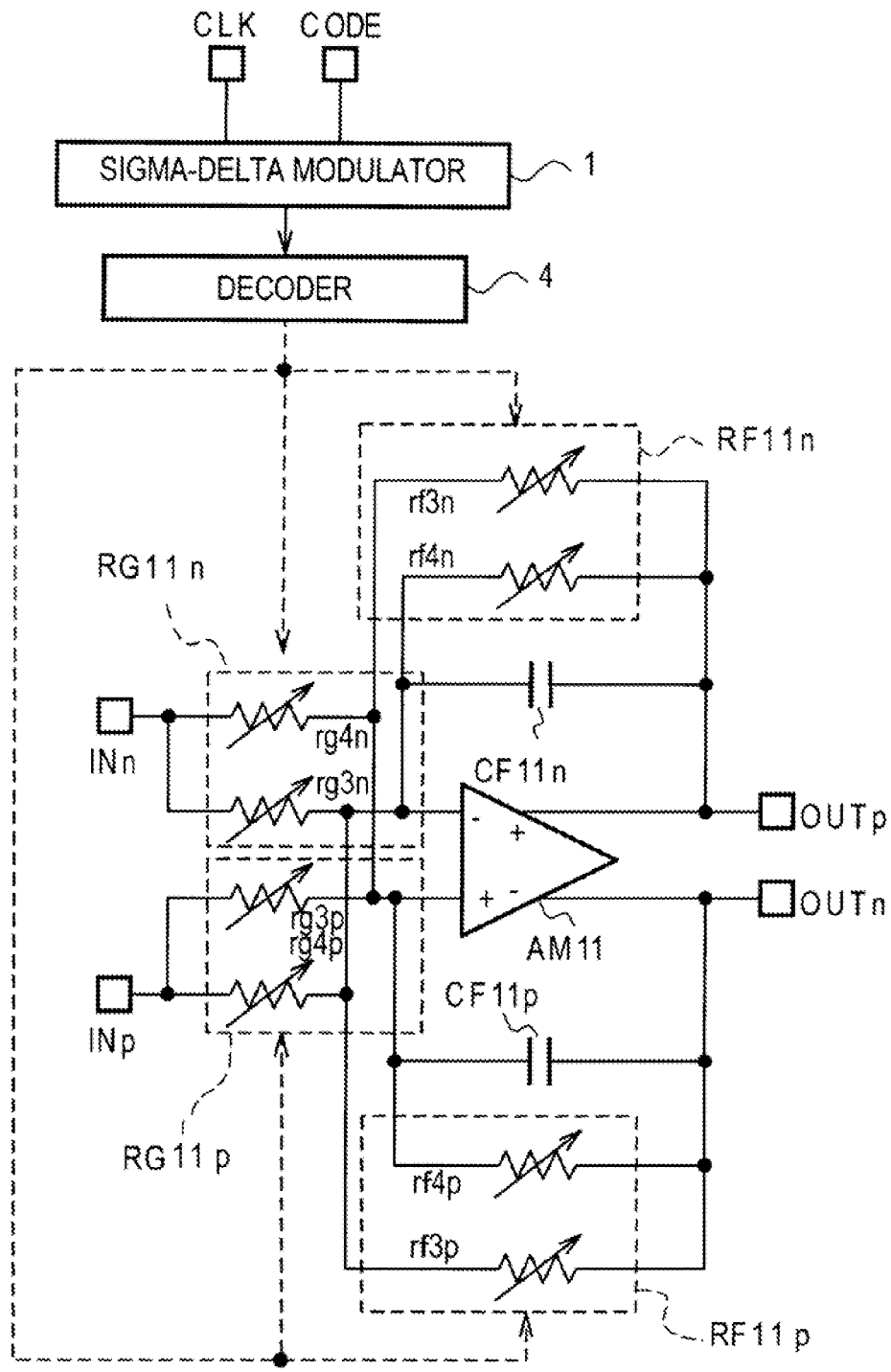
FIG. 9 illustrates an example of a fully-differential RC-LPF circuit.

Also, a configuration of the third-order MASH sigma-delta modulator 1 illustrated in FIG. 7 is similar to the configuration ("Digital Implementation") illustrated in FIG. 9 (Page 1156) of the "Rigorous Analysis of Delta-Sigma Modulators for Fractional-N PLL Frequency Synthesis", which is derived from the model ("Discrete-time model") illustrated in FIG. 3 (page 1150). The disclosure found in "Rigorous Analysis of Delta-Sigma Modulators for Fractional-N PLL Frequency Synthesis" is incorporated in this specification.

In this embodiment, in a fully-differential RC active-LPF circuit, the input resistors RG10$p$ and RG10$n$ and feedback resistors RF10$p$ and RF10$n$ are made to be variable resistors, and, according to an output signal of the decoder 5, which performs a code-conversion to the output of the third-order MASH sigma-delta modulator, the on/off-control of the unit resistors constituting the variable resistor are performed. Here, as the variable resistor, the second variable resistance module illustrated in FIG. 8A is used.

The third-order MASH sigma-delta modulator 1, operating according to an operational clock CLK, sigma-delta modulates the n-bit digital code input CODE, and outputs a signal which has the similar time transition to as in FIG. 2B. Here, outputs of the third-order MASH sigma-delta modulator 1 are discrete values in the range from −3 to +4. Therefore, the modulated output signal is 3 bit data, $2^3=8$ discrete values for the n (n>3) bit digital code input CODE. However, the 3 bit output signal changes in pseudorandom in synchronous to the operational clock CLK, and the average value of the 3 bit output signals is equal to the n bit digital code input CODE. Therefore, the 3 bit output signal having the smaller number of bit can controls the smaller number of unit resistors, but can vary the resistance of the variable resistor with higher resolution, equal to that of the n bit digital code input.

In the decoder 5, according to the output (from −3 to +4) of the third-order MASH sigma-delta modulator 1, on/off-control signal of switches 111-118, each of which is serially connected to each of the eight internal resistors 121-128 of the second variable resistance module, are generated.

When the output of the third-order MASH sigma-delta modulator 1 is "+4", thereby selecting resistor 128 having the resistance value of R, thus, in the variable resistance module, a part between a first terminal and the same-polarity second terminal has a resistance having a resistance value of R, and a part between the first terminal and the reverse-polarity second terminal becomes open. Also, when the output is "+3", thereby selecting resistor 127 having the resistance value of (4/3)*R, in the variable resistance module, the part between the first terminal and the same-polarity second terminal has a resistor having a resistance value of (4/3)*R, and the part between the first terminal and the reverse-polarity second terminal becomes open. Also, when the output is "+2", thereby selecting resistor 126 having the resistance value of 2R, thus, in the variable resistance module, the part between the first terminal and the same-polarity second terminal has a resistor having a resistance value of 2R, and the part between the first terminal and the reverse-polarity second terminal becomes open. Also, when the output is "+1", thereby selecting resistor 125 having the resistance value of 4R, thus, in the variable resistance module, the part between the first terminal and the same-polarity second terminal has a resistor having a resistance value of 4R, and the part between the first terminal and the reverse-polarity second terminal becomes open.

Also, when the output of the third-order MASH sigma-delta modulator 1 is "−1", thereby selecting resistor 124 having resistance value of −4*R, thus, in the variable resistance module, the part between the first terminal and the reverse-polarity second terminal has a resistor having a resistance value of −4*R, and the part between the first terminal and the same-polarity second terminal becomes open. Also when the output is "−2", thereby selecting resistor 123 having a resistance value of −2*R, thus, in the variable resistance module, the part between the first terminal and the reverse-polarity second terminal has a resistor having a resistance value of −2*R, and the part between the first terminal and the same-polarity second terminal becomes open. Further, when the output is "−3", thereby selecting resistor 122 having a resistance value of (−4/3)*R, thus, in the variable resistance module, the part between the first terminal and the reverse-polarity second terminal has a resistor having a resistance value of (−4/3)*R, and the part between the first terminal and the same-polarity second terminal becomes open. Also, when the output of the third-order MASH sigma-delta modulator 1 is "0", no resistor is selected, and each of the feedback routes becomes open.

Here, the reason for the resistance values of the internal resistors 122-124 being negative and the resistance values of the internal resistors 125-128 being positive is because the direction of the current passing through the internal resistors 122-124 at the time of the internal resistors 122-124 being selected is reverse to the direction of the current passing through the internal resistors 125-128 at the time of the internal resistors 122-124 being selected, therefore, the resistance value appears to have negative values.

Also, the variable resistance module can be configured substantially by seven internal resistors 122-128, without the internal resistor 121 being selected. This configuration is adopted in this embodiment for a reason from the view point of symmetry in implementing a fully-differential circuit on an LSI.

By selecting the internal resistors 121-128 in the above manner, the cut-off frequency of the filter circuit, being "1" in case of the resistor 128 of resistance value R being selected, is as follows. That is, the cut-off frequency is switched to: "3/4" in case of the resistor 127 having the resistance value (4/3)*R being selected; "1/2" in case of the resistor 126 having the resistance value 2*R being selected; and "1/4" in case of the resistor 125 having the resistance value 4*R being selected. Also, the cut-off frequency is switched to: "−3/4" in case of the resistor 122 having the resistance value (−4/3)*R being selected; "−1/2" in case of the resistor 123 having the resistance value −2*R being selected; and "−1/4" in case of the resistor 125 having the resistance value −4*R being selected.

Also, while the third-order MASH sigma-delta modulator 1, by operating according to the operational clock CLK, outputs signals having the similar time transition to as in FIG. 2B, the long-period average varies according to the value H of the n-bit digital code input CODE. That is, the long-period average=H/(2n). For example, in case of n=10, for the digital code input CODE value H=160D(in decimal digits)=0A0H (in hexadecimal digits)=01010000B(in binary digits), the long-period average=H/(2n)=160/1024=0.625. That is, according to the setting of value H of the digital code input CODE, it is enabled to vary the average value in a long period by 2n=1024 steps within the range from 0 to 1.

As explained above, in the filter circuit in which the present embodiment is applied to a fully-differential RC active filter (fully-differential RC active-LPF circuit), according to the output signal of the decoder 5, which performs a code-conversion to the output of the third-order MASH sigma-delta modulator 1, a variable control of the variable resistor is performed. That is, the on/off-controls of the unit resistors constituting the input resistors RG10$p$ and RG10$n$ and the feedback resistors RF10p and RF10n are performed. By means of this, it is enabled to switch $2^n$-step cut-off frequencies by the n-bit digital code input CODE and to maintain the gain constant.

Further, in this embodiment, as the input resistor RG10p and RG10n, a variable resistance module having the same configuration as the feedback resistor RF10p and RF10n is used, wherein the both are switched in the same manner by the same on/off-control signal, thereby maintaining the gain proportional to RF10x/RG10x constant. For switching the cut-off frequency together with the gain, the on/off-controls of the unit resistors constituting the variable resistor are performed according to the output signals of the decoder, which are code-converted from separate outputs of the sigma-delta modulator 1.

As described above, in this present embodiment, even when the variable width of the filter characteristic (the cut-off frequency) is narrow in a wide range, it is enabled, by a small number (for one variable resistance module, eight, or substantially seven) of unit resistors, to vary the elements (the feedback resistor RF10p and RF10n) which determine the filter characteristic (the cut-off frequency), and it is enabled to suppress the enlargement of the lay-out area for the circuit on an LSI together with the cost.

[Embodiment 2]

Next, by referring to FIG. 9 and FIG. 6c, a basic configuration, in which the present embodiment is applied to a fully-differential RC active filter (fully-differential RC active-LPF circuit), is explained. In FIG. 9, a fully-differential RC active-LPF circuit, to which the present embodiment is applied, is illustrated.

The filter circuit illustrated in FIG. 9 comprises the sigma-delta modulator 1, the decoder 4, and a fully-differential RC active-LPF circuit. The fully-differential RC active-LPF circuit comprises a fully-differential operational amplifier AM11, input resistors RG11p and RG11n, feedback resistors RF11p and RF11n, and feedback capacitors CF11p and CF11n. Here, the input resistors RG11p and RG11n, and the feedback resistors RF11p and RF11n are variable resistors. Also, the each pair, to be more specific, the pair of input resistors RG11p and RG11n, and the pair of feedback resistors RF11p and RF11n have the same circuit configuration.

Also the feedback capacitor CF11p is connected between the positive-polarity input terminal and the negative-polarity output terminal of the fully-differential operational amplifier AM11, and the feedback capacitor CF11n is connected between the negative-polarity input terminal and the positive-polarity output terminal of the fully-differential operational amplifier AM11.

Also, resistor rg3p between a first terminal and the same-polarity second terminal of the input resistor RG11p is connected to between a positive-polarity input terminal of the fully-differential operational amplifier AM11 and the positive-polarity input terminal INp of the filter circuit. Also, resistor rg4p between the first terminal and the reverse-polarity second terminal of the input resistor RG11p is connected to between the negative-polarity input terminal of the fully-differential operational amplifier AM11 and the positive-polarity input terminal INp of the filter circuit. Also, resistor rg3n between a first terminal and the same-polarity second terminal of the input resistance RG11n is connected to the negative-polarity input terminal of the fully-differential operational amplifier AM11 and the negative-polarity input terminal INn of the filter circuit. Further, resistor rg4n between the first terminal and the reverse-polarity second terminal of the input resistor RG11n is connected to the positive-polarity input terminal of the fully-differential operational amplifier AM11 and the negative-polarity input terminal INn of the filter circuit.

Also, resistor rf3p between a first terminal and the same-polarity second terminal of the feedback resistor RF11p is connected to between the negative-polarity input terminal and the positive output terminal of the fully-differential operational amplifier AM11. Also, resistor rf4p between the first terminal and the reverse-polarity second terminal of the feedback resistor RF11p is connected to between the positive-polarity input terminal and the positive output terminal of the fully-differential operational amplifier AM11. Also, rf3n between the first terminal and the same-polarity second terminal of the feedback resistor RF11n is connected to the positive-polarity input terminal and the negative output terminal of the fully-differential operational amplifier AM11. Further, resistor rf4n between the first terminal and the reverse-polarity second terminal of the feedback resistor RF11n is connected to the negative-polarity input terminal and the negative-polarity output terminal of the fully-differential operational amplifier AM11.

In the configuration of this filter circuit, the cut-off frequency is proportional to $1/(RF11x*CF11x)$, for x=p or x=n, and the gain is RF11x/RG11x. Here, the input resistors RG11p and RG11n and the feedback resistors RF11p and RF11n are made to be variable resistors, and, according to the output signal of the decoder 4, which performs a code-conversion to the output of the sigma-delta modulator 1, the on/off-controls of the unit resistors constituting the variable resistor are performed. By means of this, it is enabled to switch multiple steps of the cut-off frequencies, and together with this, to maintain the gain constant.

Also, the circuit configuration of the third variable resistance module, which is used to the variable resistor of this embodiment, is illustrated in FIG. 6C. The third variable resistance module, as illustrated in FIG. 6C, comprises a first terminal OA, a same-polarity second terminal IA having the same-polarity as the first terminal OA, and a reverse-polarity second terminal IB having the reverse-polarity, and comprises 2*n+1 (7, for n=3) units of internal resistors 152-158. The seven internal resistors 152-158 have the resistance value R (R is an arbitrary value), and terminals on one side are connected to the first terminal OA. Also, terminals on the other side are connected, via first switches 134, 136, 138, 140, 142, 144, and 146, which are on/off-controlled by separate first control signals with respect to each of the internal resistors 152-158, to the same-polarity second terminal IA, and are connected, via first switches 133, 135, 137, 139, 141, 143, and 145, which are on/off-controlled by the second control signals which are inverted signal of the first control signals, to the reverse-polarity second terminal IB.

Figure 10:
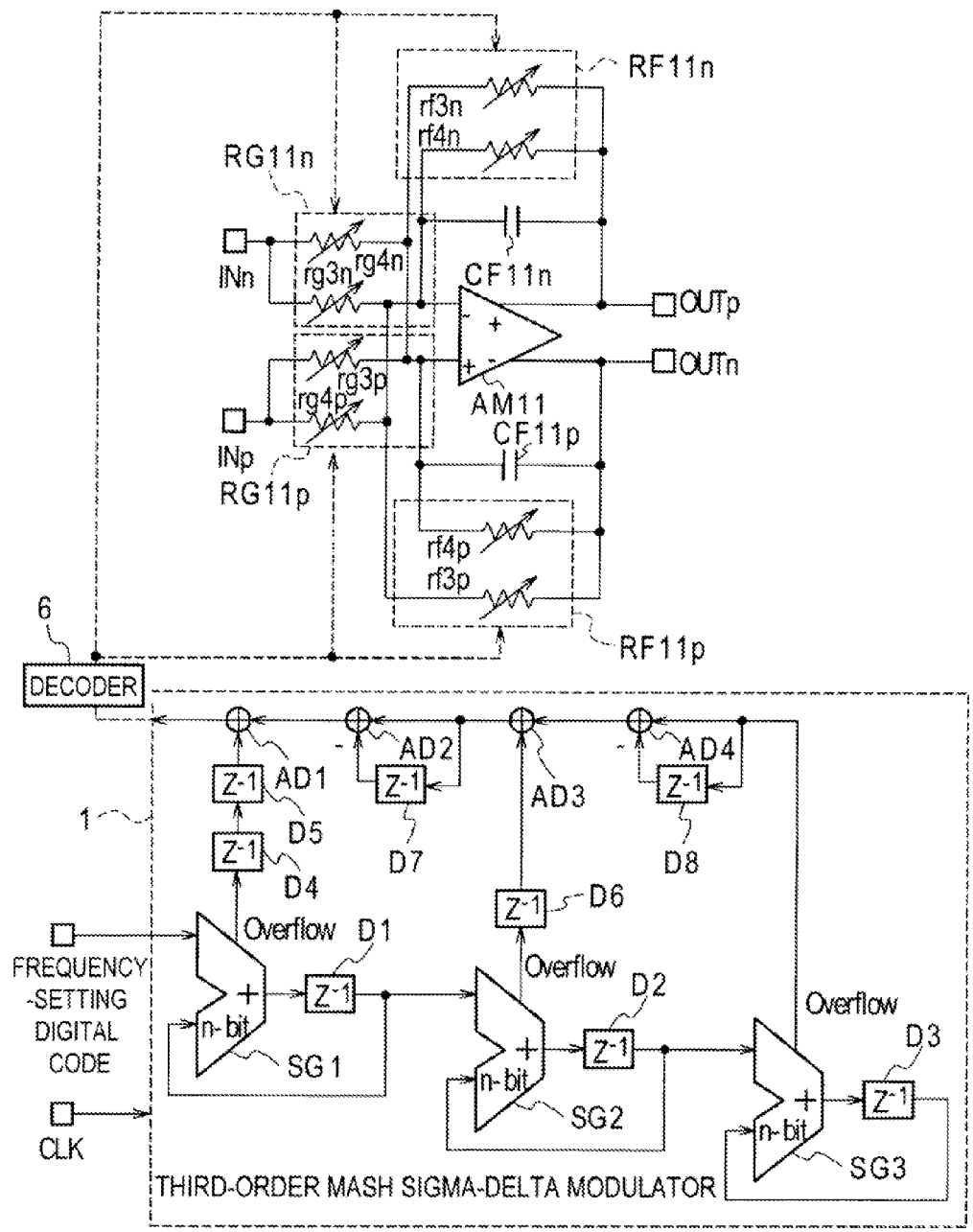
FIG. 10 illustrates an example of a fully-differential RC-LPF circuit.
Figures 11A, 11B:
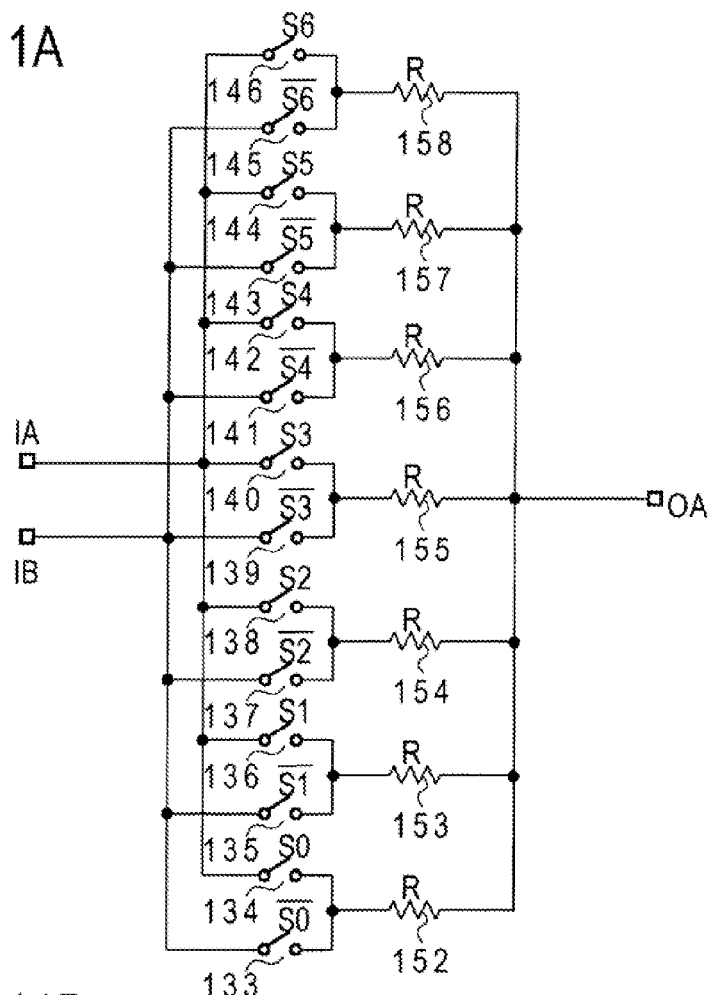
FIG. 11a, 11b illustrate examples of resistance value setting of a variable resistance module.

Next, by referring to FIG. 10 and FIG. 11, various configurations, in which the present embodiment is applied to a fully-differential RC active filter (a fully-differential RC active-LPF circuit), are explained. In FIG. 10, a specific circuit diagram of a fully-differential RC active-LPF circuit, to which the present embodiment is applied, is illustrated. Also, in FIG. 11A, a circuit diagram of the third variable resistance module, which is used, is illustrated, and in FIG. 11B, a setting of the resistance value of the variable resistance module according to the sigma-delta modulator 1 is illustrated.

The filter circuit illustrated in FIG. 10 comprises the sigma-delta modulator 1, a decoder 6, and a fully-differential RC active-LPF circuit. The fully-differential active-LPF circuit comprises the fully-differential operational amplifier AM11, the input resistors RG11p and RG11n, the feedback resistors RF11p and RF11n, and feedback capacitors CF11p and CF11n, and has the same circuit configuration as in FIG. 9.

Also, as the sigma-delta modulator 1, a third-order MASH sigma-delta modulator, which is equivalent to the embodiment 1, is used.

In this embodiment, in the fully-differential RC active-LPF circuit, the input resistors RG11$p$ and RG11$n$, and the feedback resistors RF11$p$ and RF11$n$ are made to be variable resistors, and, according to the output signal of the decoder 6, which performs a code-conversion to the output of the third-order MASH sigma-delta modulator 1, the on/off-controls of the unit resistors constituting the variable resistor are performed. Here, as the variable resistor, the third variable resistance module illustrated in FIG. 11A is used.

The third-order MASH sigma-delta modulator 1, by operating according to the operational clock CLK, sigma-delta modulates the n-bit digital code input CODE, and outputs a signal having the similar time transition to as illustrated in FIG. 2B. Here, outputs of the third-order MASH sigma-delta modulator 1 are discrete values from −3 to +4.

In decoder 6, according to the output of the third-order MASH sigma-delta modulator 1 (from −3 to +4), on/off-control signals S0-S6 are generated to be supplied to the third variable resistance module.

When the output of the third-order MASH sigma-delta modulator 1 is +4, seven resistors 152-158 are selected between a first terminal and the same-polarity second terminal, and no selection is made between the first terminal and the reverse-polarity second terminal. At this time, between the first terminal and the same-polarity second terminal of the variable resistance module, a resistor having a resistance value of (1/7)*R is held. Also, when the output is +3, six resistors 152-157 are selected between the first terminal and the same-polarity second terminal, and, together with this, one resistor 158 is selected between the first terminal and the reverse-polarity second terminal. At this time, between the first terminal and the same-polarity second terminal of the variable resistance module, a resistor having a resistance value of (1/6)*R is held, and, between the first terminal and the reverse-polarity second terminal, a resistor having a resistance value of R is held.

Also, when the output of the third-order MASH sigma-delta modulator is +2, five resistors 152-156 are selected between the first terminal and the same-polarity second terminal, and, together with this, two resistors 157 and 158 are selected between the first terminal and the reverse-polarity second terminal. At this time, between the first terminal and the same-polarity second terminal of the variable resistance module, a resistor having a resistance value of (1/5)*R is held, and, between the first terminal and the reverse-polarity second terminal, a resistor having a resistance value of (−1/2)*R is held. Also, when the output is +1, four resistors 152-155 are selected between the first terminal and the same-polarity second terminal, and, together with this, three resistors 156-158 are selected between the first terminal and the reverse-polarity second terminal. At this time, between the first terminal and the same-polarity second terminal of the variable resistance module, a resistor having a resistance value of (1/4)*R is held, and, between the first terminal and the reverse-polarity second terminal, a resistor having a resistance value of (−1/3)*R is held.

Also, when the output of the third-order MASH sigma-delta modulator is 0, three resistors 152-154 are selected between the first terminal and the same-polarity second terminal, and four resistors 155-158 are selected between the first terminal and the reverse-polarity second terminal. At this time, between the first terminal and the same-polarity second terminal of the variable resistance module, a resistor having a resistance value of (1/3)*R is held, and, between the first terminal and the reverse-polarity second terminal, a resistor having a resistance value of (−1/4)*R is held. Also, when the output is −1, two resistors 152 and 153 are selected between the first terminal and the same-polarity second terminal, and five resistors 154-158 are selected between the first terminal and the reverse-polarity second terminal. At this time, between the first terminal and the same-polarity second terminal of the variable resistance module, a resistor having a resistance value of (1/2)*R is held, and, between the first terminal and the reverse-polarity second terminal, a resistor having a resistance value of (−1/5)*R is held.

Also, when the output of the third-order MASH sigma-delta modulator is −2, one resistor 152 is selected between the first terminal and the same-polarity second terminal, and, together with this, six resistors 153-158 are selected between the first terminal and the reverse-polarity second terminal. At this time, between the first terminal and the same-polarity second terminal of the variable resistance module, a resistor having a resistance value of R is held, and, between the first terminal and the reverse-polarity second terminal, a resistor having a resistance value of (−1/6)*R is held. Further, when the output is −3, no resistor is selected between the first terminal and the same-polarity second terminal, and seven resistors 152-158 are selected between the first terminal and the reverse-polarity second terminal. At this time, between the first terminal and the reverse-polarity second terminal, a resistor having a resistance value of (−1/7)*R is held.

Here, the reason for the resistance values between the first terminal and the reverse-polarity second terminal being negative is because the direction of the current passing between the first terminal and the reverse-polarity second terminal is reverse to the direction of the current passing between the first terminal and the same-polarity second terminal, therefore, the resistance value appears to have negative value.

By the on/off-control signals S0-S6 controlling switches in the above manner, the cut-off frequency of the filter circuit, for example, between the first terminal and the same-polarity second terminal, is as follows. That is, the cut-off frequency, being 7 for the output of 4 of the third-order MASH sigma-delta modulator 1, is switched to: 5 for the output of +3; 3 for the output of +2; 1 for the output of +1; −1 for the output of 0; −3 for the output of −1; −5 for the output of −2; and −7 for the output of −3.

Also, while the third-order MASH sigma-delta modulator 1, by operating according to the operational clock CLK, outputs a signal having the similar time transition to as in FIG. 2B, the average in a long period varies according to the value H of the n-bit digital code input CODE. That is, the long-period average=H/(2n). For example, in case of n=10, for the digital code input CODE value H=160D(in decimal digits) =0A0H(in hexadecimal digits)=01010000B(in binary digits), the long-period average=H/(2n)=160/1024=0.625. That is, according to the setting of the value H of the digital code input CODE, the average value in a long period can be varied by 2n=1024 steps within the range from 0 to 1.

As explained above, in the filter circuit, in which the present embodiment is applied to a fully-differential RC active filter (fully-differential RC active-LPF circuit), according to the output signal of the decoder 5, which performs a code-conversion to the output of the third-order MASH sigma-delta modulator 1, the variable control of the variable resistor is performed. That is, the on/off-controls of the unit resistors constituting the input resistors RG10$p$ and RG10$n$ and the feedback resistors RF10$p$ and RF10$n$ are performed. By means of this, it is enabled to switch 2n-step cut-off frequencies by the n-bit digital code input CODE, and, together with this, to maintain the gain constant.

Further, in this embodiment, for the input resistor RG11$p$ and RG11$n$, the variable resistance module having the same configuration as the feedback resistor RF11$p$ and RF11$n$, and the both are varied by the same on/off-control signal in the same manner, thus enabling to maintain the gain proportional to RF10$x$/RG10$x$ constant. For switching the cut-off frequency together with the gain, the on/off-controls of the unit resistors constituting the variable resistor are performed according to the output signals of the decoder, which are code-converted from separate outputs of the sigma-delta modulator 1.

As described above, in this embodiment, even when the variable width of the filter characteristic (the cut-off frequency) is narrow in a wide range, it is enabled to vary, by a small number(for one variable resistance module, eight, or substantially seven) of unit resistors, the elements (the feedback resistor RF11$p$ and RF11$n$) which determines the filter characteristic (cut-off frequency), and it is enabled to suppress the enlargement of the lay-out area for the circuit on an LSI together with the cost.

[Embodiment 3]

Figure 12:
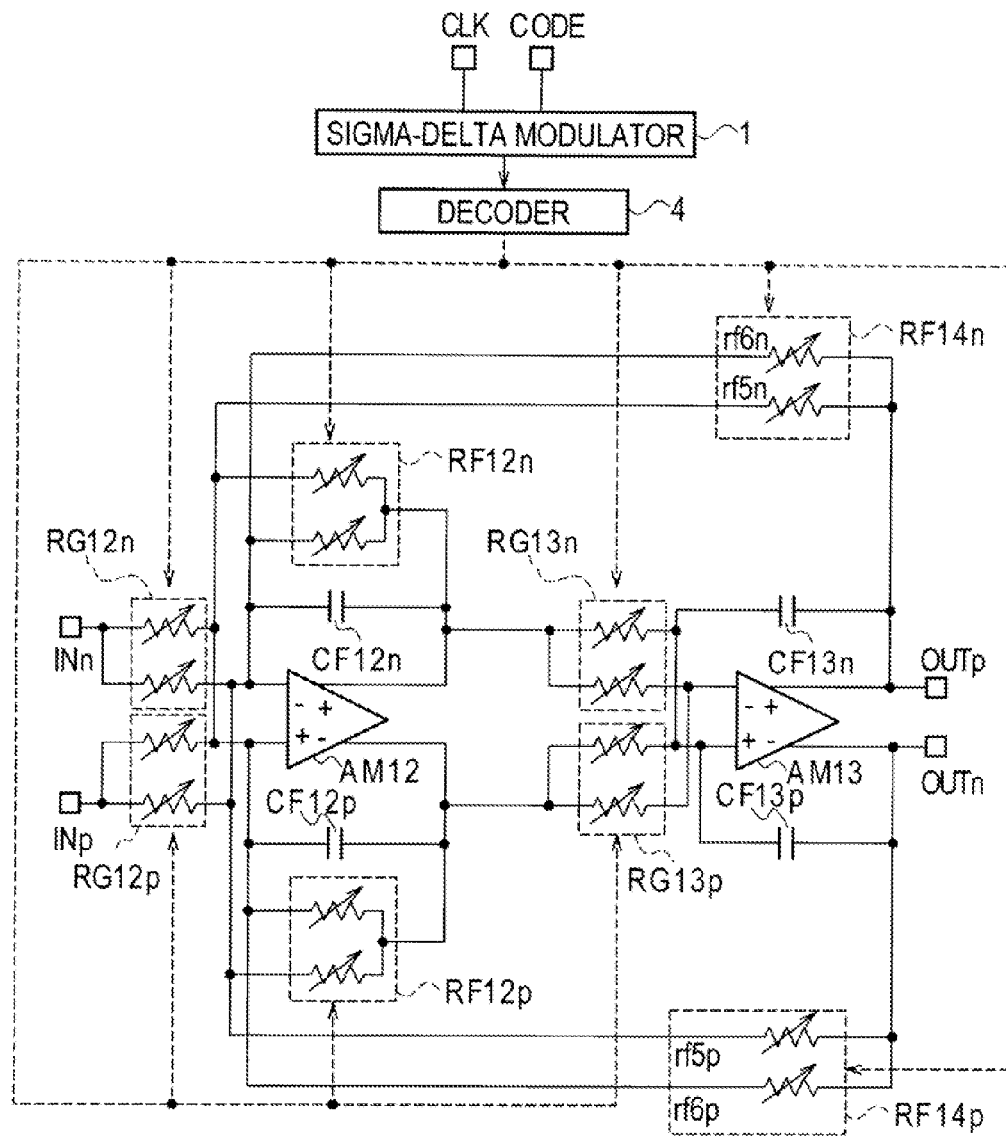
FIG. 12 illustrates an example of an RC biquad LPF circuit.

Next, by referring to FIG. 12, a basic configuration, in which the present embodiment is applied to a fully-differential biquad LPF circuit, is explained. In FIG. 12, a fully-differential biquad LPF circuit, to which the present embodiment is applied, is illustrated The filter circuit illustrated in FIG. 12 comprises the sigma-delta modulator 1, the decoder 4, and a fully-differential biquad LPF circuit. The fully-differential biquad LPF circuit comprises a first stage filter circuit and a second stage filter circuit which are similar to those of the embodiment 2, and inter-stage feedback resistors RF14$p$ and RF14$n$ which feedback the output of the second filter circuit to the input side of the first filter circuit.

The first stage of the filter circuit comprises a fully-differential operational amplifier AM12, input resistors RG12$p$ and RG12$n$, feedback resistors RF12$p$ and RF12$n$, and feedback capacitors CF12$p$ and CF12$n$. Also, the second stage of the filter circuit comprises a fully-differential operational amplifier AM13, input resistors RG13$p$ and RG13$n$, feedback resistors RF14$p$ and RF14$n$, and feedback capacitors CF13$p$ and CF13$n$.

Here, the input resistors RG12$p$, RG12$n$, RG13$p$, and RG13$n$, the feedback resistors RF12$p$ and RF12$n$, and the inter-stage feedback resistors RF14$p$ and RF14$n$ are variable resistors. Also, the each pair, to be more specific, the pair of input resistors RG12$p$ and RG12$n$, the pair of input resistors RG13$p$ and RG13$n$, and the pair of feedback resistors RF12$p$ and RF12$n$ have the same circuit configuration.

Also, resistor rf5$p$ between a first terminal and a same-polarity second terminal of the inter-stage feedback resistor RG14$p$ is connected to the negative-polarity output terminal OUTn of the filter circuit and the negative-polarity input terminal of the fully-differential operational amplifier AM12. Also, resistor rf6$p$ between a first terminal and the reverse-polarity second terminal of the inter-stage feedback resistor RF14$p$ is connected to the negative-polarity output terminal OUTn of the filter circuit and the positive-polarity input terminal of the fully-differential operational amplifier AM12. Also, resistor rf6$n$ between a first terminal and the same-polarity second terminal of the inter-stage feedback resistor RF14$n$ is connected to the positive-polarity output terminal OUTp of the filter circuit and the negative-polarity input terminal of the fully-differential operational amplifier AM12. Also, resistor rf5$n$ between the first terminal and the reverse-polarity second terminal of the inter-stage feedback resistor RF14$n$ is connected to the positive-polarity output terminal OUTp of the filter circuit and the positive-polarity output terminal of the fully-differential operational amplifier AM12.

Here, relations of connection within the first stage of the filter circuit is equivalent to the relations of connection within the RC active-LPF circuit of the embodiment 2, and relations of connection within the second stage of the filter circuit is equivalent to the relations of connection within the RC active-LPF circuit of the embodiment 2, with the feedback resistors RF11$p$ and RF11$n$ being removed.

Figure 13:
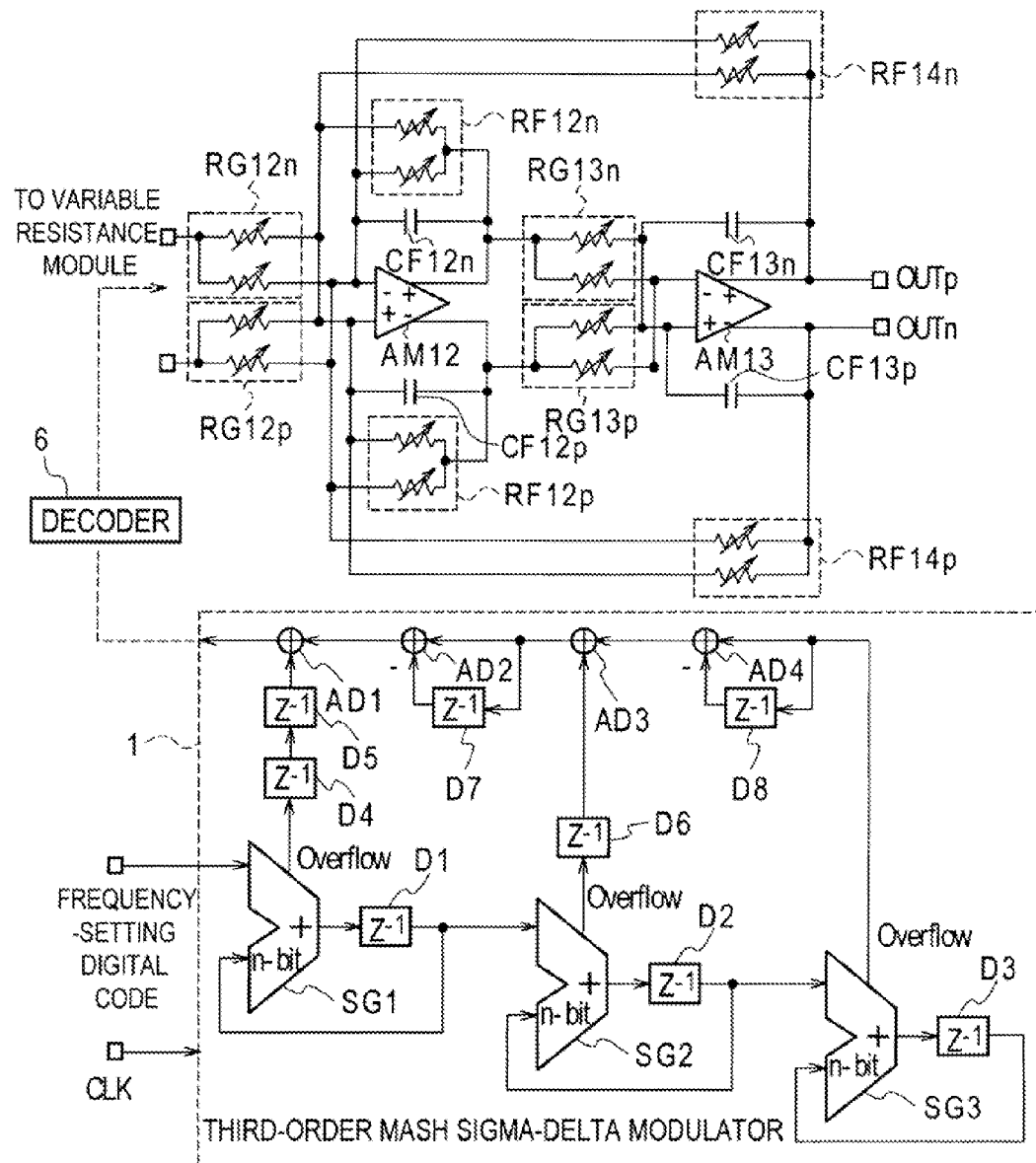
FIG. 13 illustrates an example of a fully-differential RC biquad LPF circuit.

Next, by referring to FIG. 13, various configuration, in which the present embodiment is applied to a fully-differential biquad LPF circuit, is explained. In FIG. 13, a specific circuit diagram of a fully-differential biquad LPF circuit, to which the present embodiment is applied, is illustrated.

The filter circuit illustrated in FIG. 13 comprises the sigma-delta modulator 1, the decoder 6, and a fully-differential RC biquad LPF circuit. The fully-differential RC biquad LPF circuit comprises the first stage and the second stage of the filter circuit, and inter-stage feedback resistors RF14$p$ and RF14$n$ which feedback the output of the second filter circuit to the input side of the first filter circuit, and has the same circuit configuration as in FIG. 12. Also, as the sigma-delta modulator 1, a third-order MASH sigma-delta modulator, which is equivalent to those of the embodiments 1 and 2, is used.

In this embodiment, in a fully-differential RC active-LPF circuit, the input resistors RG12$p$, RG12$n$, RG13$p$, and RG13$n$, the feedback resistors RF12$p$ and RF12$n$, and the inter-stage feedback resistances RF14$p$ and RF14$n$ are made to be variable resistances. Also, according to the output of the decoder 6, which performs a code-conversion to the output of the third-order MASH sigma-delta modulator, the on/off-controls of the unit resistances constituting the variable resistances are performed. Here, as the variable resistance, the third variable resistance module illustrated in the embodiment 2 is used.

Also, the third-order MASH sigma-delta modulator 1 operates according to the operational clock CLK in the same manner as the embodiment 2, and the average in a long period varies according to the value H of the n-bit digital code input CODE. That is, the long period average=H/(2n). For example, in case of n=10, according to the setting of the value H of the digital code input CODE, it is enabled to vary the average value in a long period by 2n=1024 steps within the range from 0 to 1.

Here, in the configuration of the filter circuit of this embodiment, it can be considered that the cut-off frequency is proportional to (RG13$x$*RF14$x$*CF12$x$*CF13$x$)–1/2, for x=p or x=n, and that the gain is RF14$x$/RG12$x$, for x=p or x=n. Therefore, by performing variable control of the variable resistor according to the output of the third-order MASH sigma-delta modulator 1, it is enabled to switch the cut-off frequency, and, together with this, to maintain the gain constant.

As explained above, in this embodiment, according to the output signal of the decoder 6, which performs a code-conversion to the output of the third-order MASH sigma-delta modulator 1, the variable control of the variable resistor is performed. That is, the on/off-controls of the unit resistors constituting the input resistors RG12$p$, RG12$n$, RG13$p$, and RG13$n$, the feedback resistors RF10$p$ and RF10$n$, and the inter-stage feedback resistors RF14$p$ and RF14$n$, are performed. By means of this, it is enabled to switch 2n-step cut-off frequencies by n-bit digital code input CODE, and, together with this, to maintain the gain constant.

Also, in this embodiment, even when the variable width of filter characteristic (cut-off frequency) is narrow in a wide range, it is enabled to vary, by a small number (for one variable resistance module, seven) of unit resistors, the elements (the feedback resistor RF10p and RF10n) which determine the filter characteristic (the cut-off frequency), and it is enabled to suppress the enlargement of the lay-out area for the circuit on an LSI together with the cost.

[Embodiment 4]

Figure 14:
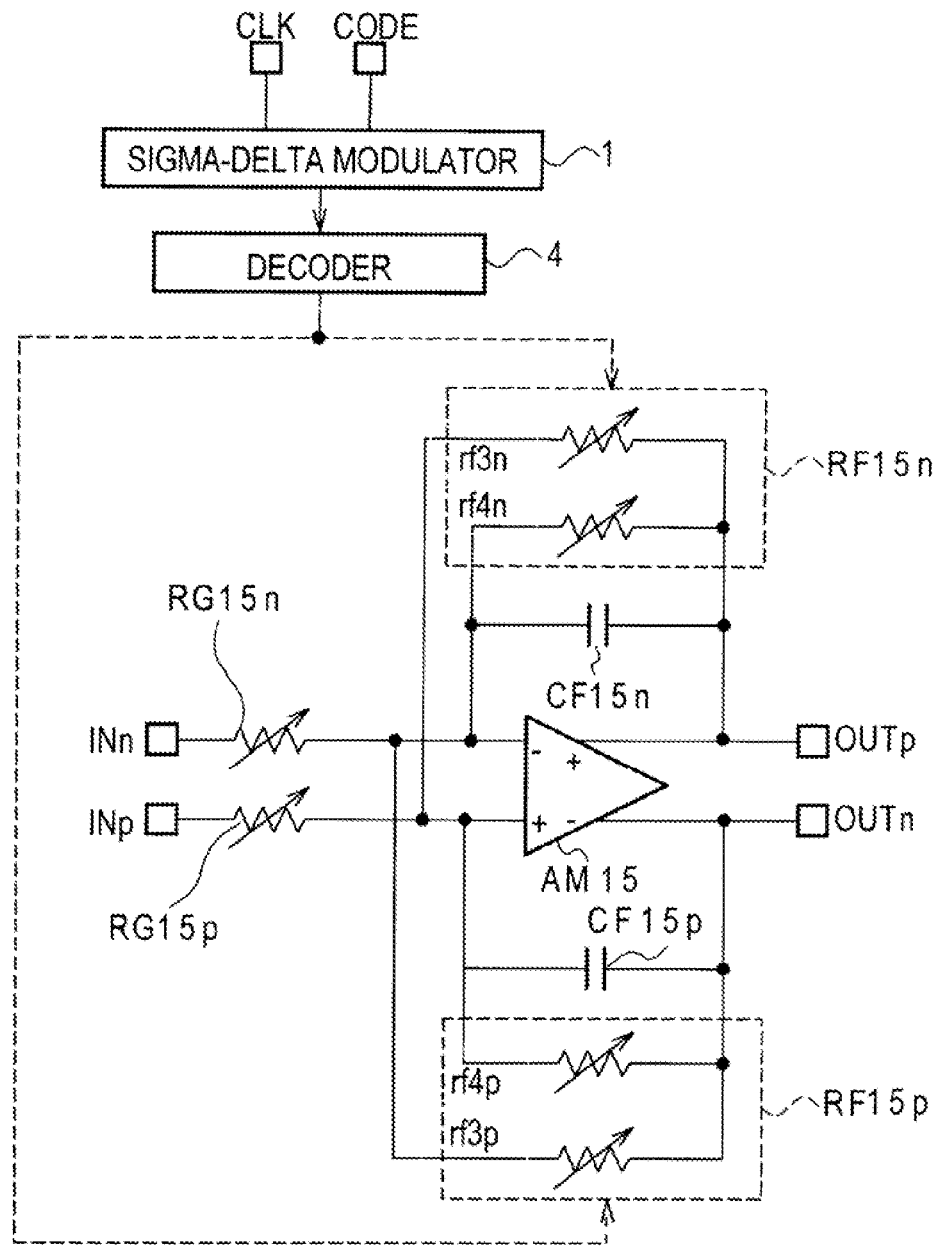
FIG. 14 illustrates an example of a fully-differential RC biquad LPF circuit.

Next, a basic configuration (No. 3), in which the present embodiment is applied to a fully-differential RC active filter (fully-differential RC active-LPF circuit), is explained. In FIG. 14, a fully-differential RC active-LPF circuit, to which the present embodiment is applied, is illustrated.

The filter circuit illustrated in FIG. 14 comprises the sigma-delta modulator 1, the decoder 4, and a fully-differential RC active-LPF circuit. The fully-differential RC active-LPF circuit comprises a fully-differential operational amplifier AM15, input resistors RG15p and RG15n, feedback resistors RF15p and RF15n, and feedback capacitors CF11p and CF11n.

Here, the input resistors RG15p and RG15n, and the feedback resistors RF15p and RF15n are made to be variable resistors. While the feedback resistors RF15p and RF15n are, similarly to the configuration of the embodiment 2 (FIG. 9), perform variable control of the resistance values according to the output of the sigma-delta modulator 1, variable control of the resistance values of the input resistors RF15p and RF15n, differently from the embodiment 2, is not performed according to the output of the sigma-delta modulator 1. Also, the feedback resistors RF15p and RF15n have the same circuit configuration.

Also, the feedback capacitor CF15p is connected between the positive-polarity input terminal and the negative-polarity output terminal of the fully-differential operational amplifier AM15, and the feedback capacitor CF15n is connected between the negative-polarity input terminal and the positive-polarity output terminal of the fully-differential operational amplifier AM15.

Also, resistor rf4p between the first terminal and the same-polarity second terminal of the feedback resistor RF15p is connected to between the positive-polarity input terminal and the positive-polarity input terminal of the fully-differential operational amplifier AM15. Also, resistor rf3p between the first terminal and the reverse-polarity second terminal of the feedback resistor RF15p is connected to between the negative-polarity input terminal and the negative-polarity output terminal of the fully-differential operational amplifier AM15. Also, resistor rf4n between a first terminal and the same-polarity second terminal of the feedback resistor RF15n is connected to between the negative-polarity input terminal and the positive-polarity output terminal of the fully-differential operational amplifier AM15. Further, resistor rf3n between the first terminal and the reverse-polarity second terminal of the feedback resistor RF15n is connected to between the positive-polarity input terminal and the positive-polarity output terminal of the fully-differential operational amplifier AM15.

In the configuration of this filter circuit, the cut-off frequency is proportional to $1/(RF15x*CF15x)$, for x=p or x=n. Here, the feedback resistors FG15p and FG15n are made to be variable resistors, and, according to the output signal of the decoder 4, which performs a code-conversion to the output of the sigma-delta modulator 1, the on/off-controls of the unit resistors constituting the variable resistor are performed. By means of this, it is enabled to switch multiple steps of the cut-off frequencies.

Also, as for the gain which is proportional to $(RF15x/CF15x)$, for x=p or x=n, the input resistors RG15p and RG15n are made to be variable resistors, and by using not the output signal of the sigma-delta modulator 1 but another code generating means, the on/off-controls of the unit resistors constituting the variable resistor are performed. By means of this, in comparison with the configuration of the embodiment 2 in which the sigma-delta modulator 1 is used, it is enabled, as for the gain characteristic, to suppress the influence of high-frequency noises of the sigma-delta modulator 1.

Figure 15:
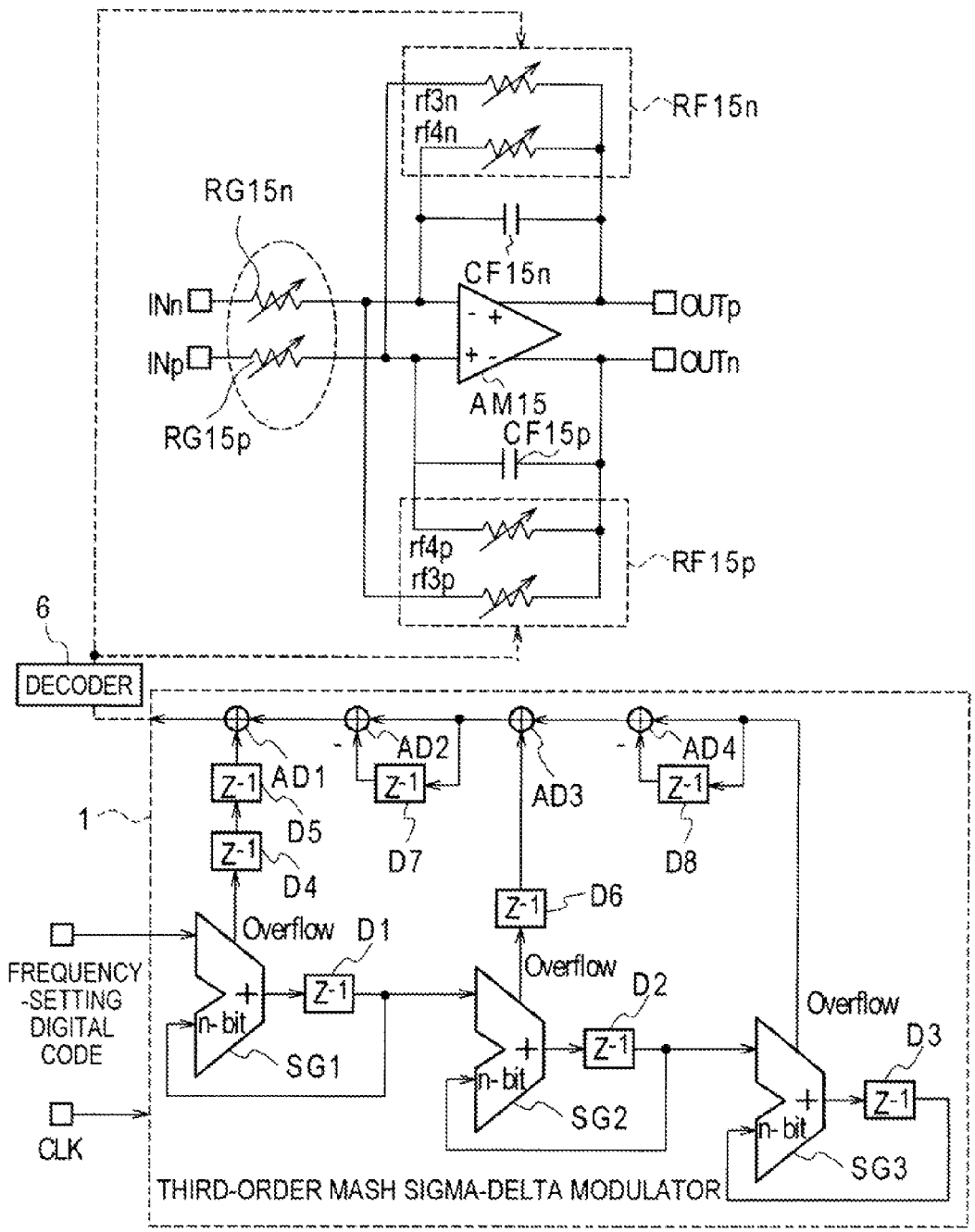
FIG. 15 illustrates an example of a fully-differential RC-LPF circuit.

Next, by referring to FIG. 15, a deploying configuration (No. 3), in which the present embodiment is applied to a fully-differential RC active filter (a fully-differential RC active-LPF circuit), is explained. In FIG. 15, a specific circuit diagram of a fully-differential RC active-LPF circuit, to which the present embodiment is applied, is illustrated.

The filter circuit illustrated in FIG. 15 comprises the sigma-delta modulator 1, the decoder 6, and a fully-differential RC active-LPF circuit. The fully-differential RC active-LPF circuit comprises the fully-differential operational amplifier AM15, the input resistors RG15p and RG15n, the feedback resistors RF15p and RF15n, and the feedback capacitors CF15p and CF15n, and has the same circuit configuration as in FIG. 12. Also, as the sigma-delta modulator 1, a third-order MASH sigma-delta modulator, which is equivalent to the embodiment 2, is used.

In this embodiment, in the fully-differential RC active-LPF circuit, the input resistors RG15p and RG15n and the feedback resistors RF15p and RF15n are made to be variable resistors. As for the feedback resistors RF15p and RF15n, according to the output signal of the decoder 6, which performs a code-conversion to the output of the third-order MASH sigma-delta modulator 1, the on/off-controls of the unit resistors constituting the variable resistor are performed. And, as for the input resistors RG15p and RG15n, by using other code generating means except for the sigma-delta modulator 1, the on/off-control of the unit elements constituting the variable resistor are performed. Here, for the feedback resistors RG15p and RF15n, the third variable resistance module, as with the embodiment 2, is used.

As explained above, in the filter circuit, in which the present embodiment is applied to a fully-differential RC active-LPF circuit, according to the output signal of the decoder 6, which performs a code-conversion to the output of the third-order MASH sigma-delta modulator 1, the variable controls of the unit resistors constituting the feedback resistors RF11p and RF11n are performed. By means of this, it is enabled to switch 2n-step cut-off frequencies by n-bit digital code input CODE, and, as a result, it is enabled to suppress the enlargement of the lay-out area for the circuit on an LSI together with the cost.

Also, the input resistors RG15p and RG15n are made to be variable resistors, and the on/off-control of the unit resistors constituting the variable resistors are performed without using the output of the sigma-delta modulator 1 but by using other code generating means. By means of this, in comparison with a configuration of the embodiment 2, in which the sigma-delta modulator 1 is used, it is enabled, as for the gain characteristic, to better suppress the influence of the high-frequency noises of the sigma-delta modulator 1.

[Embodiment 5]

Figure 16:
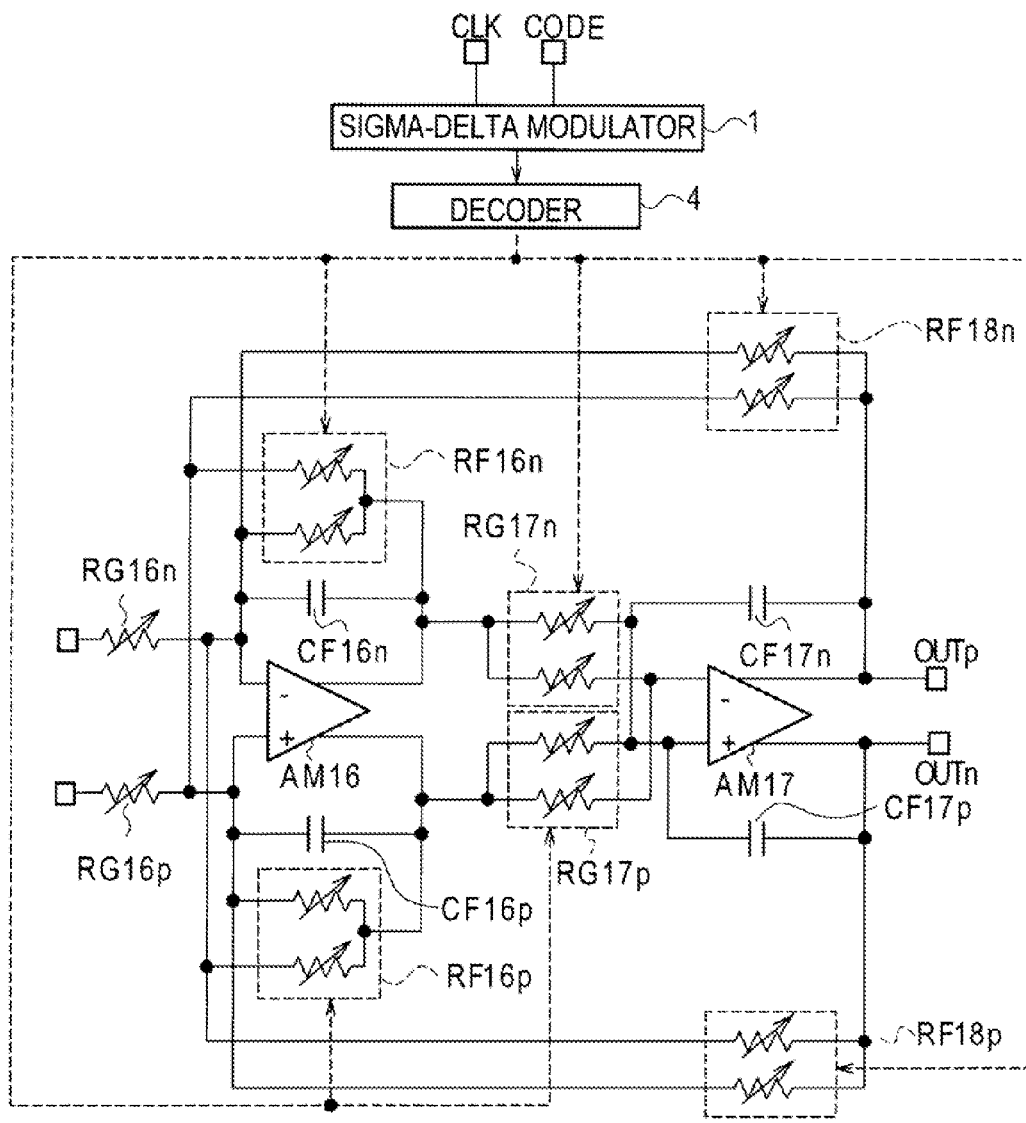
FIG. 16 illustrates an example of an RC biquad LPF circuit.

Next, by referring to FIG. 16, a basic configuration (No. 2), in which the present embodiment is applied to a fully-differential RC biquad LPF circuit, is explained. In FIG. 16, a fully-differential biquad LPF circuit, to which the present embodiment is applied, is illustrated.

The filter circuit illustrated in FIG. 16 comprises the sigma-delta modulator 1, the decoder 4, and a fully-differential RC biquad LPF circuit. The fully-differential RC biquad LPF circuit, similarly to that of the embodiment 3, comprises a first stage filter circuit and a second stage filter circuit, and inter-stage feedback resistors RF18p and RF18n, which feedback the output of the second filter circuit to the input side of the first filter circuit. Here, as for the second stage of the filter circuit, this embodiment is similar to the embodiment 3, however, as for the first stage of the filter circuit, this embodiment differs from the configuration of the embodiment 3 in having the equivalent configuration to the fully-differential RC-LPF circuit of the embodiment 4.

The first stage of the filter circuit comprises a fully-differential operational amplifier AM16, input resistors RG16p and RG16n, feedback resistors RF16p and RF16n, and feedback capacitors CF16p and CF16n. Also, the second stage of the filter circuit comprises a fully-differential operational amplifier AM17, input resistors RG17p and RG17n, feedback capacitors CF17p and CF17n, and inter-stage feedback resistors RF18p, RF18n.

Here, the input resistors RG16p, RG16n, RG17p, and RG17n, the feedback resistors RF16p and RF16n, and the inter-stage feedback resistors RF18p and RF18n are variable resistors. Here, the input resistors RG17p and RG17n, the feedback resistors RF16p and RF16n, and the inter-stage feedback resistors RF18p and RF18n perform, similarly to the configuration of the embodiment 3 (see FIG. 12), according to the output of the sigma-delta modulator 1, the variable control of the resistance value. However, the variable controls of the resistance values of the input resistors RG16p and RG16n differ from the embodiment 3, in being performed not according to the output of the sigma-delta modulator 1. Also, the each pair have the same circuit configuration.

Here, since relations of connection of the inter-stage feedback resistors RF18p and RF18n and relations of connection within the second stage of the filter circuit are equivalent to the relations of connection within the RC biquad LPF circuit of the embodiment 3, the explanation is omitted. Also, since relations of connection within the first stage of the filter circuit are equivalent to the relations of connection within the RC active-LPF circuit of the embodiment 4, the explanation is omitted.

Figure 17:
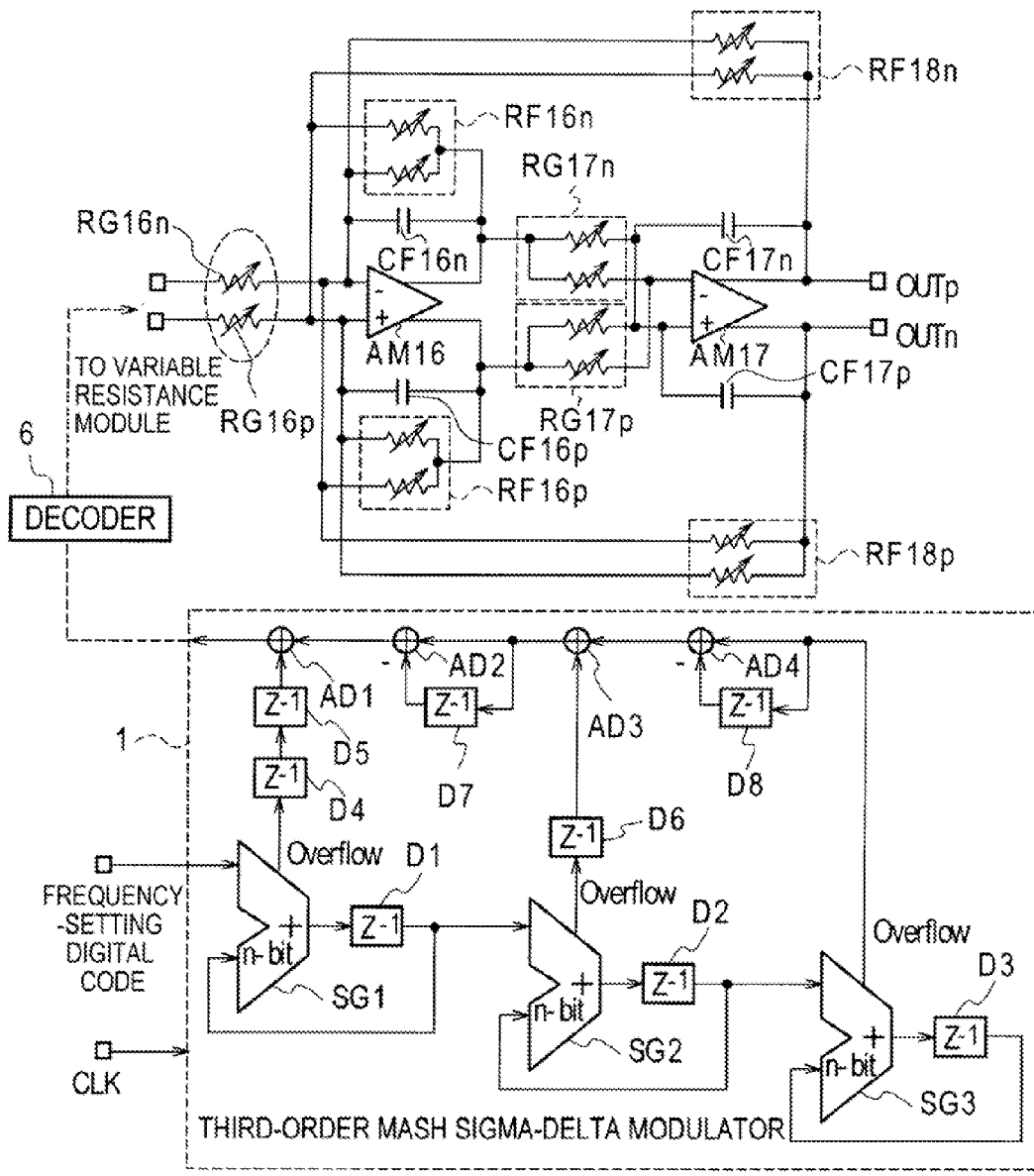
FIG. 17 illustrates an example of a fully-differential RC biquad LPF circuit.

Next, by referring to FIG. 17, various configuration (No. 2), in which the present embodiment is applied to a fully-differential RC biquad LPF circuit, is explained. In FIG. 17, a fully-differential RC biquad LPF circuit to which the present embodiment is applied, is illustrated.

The filter circuit illustrated in FIG. 17 comprises the sigma-delta modulator 1, the decoder 6, and a fully-differential RC biquad LPF circuit. The fully-differential RC biquad LPF circuit comprises a first stage filter circuit and a second stage filter circuit, and the inter-stage feedback RF18p and RF18n, which feedback the output of the second filter circuit to the input side of the first filter circuit, and has the same configuration as FIG. 16. Also, as the sigma-delta modulator 1, a third-order MASH sigma-delta modulator, which is equivalent to that of the embodiments 2, is used.

In this embodiment, in the fully-differential RC active-LPF circuit, the input resistors RG17p and RG17n, the feedback resistors RF16p and RF16n, and the inter-stage feedback resistors RF18p and RF18n are made to be variable resistors. Also, according to the output signal of the decoder 6, which performs a code-conversion to the output of the third-order MASH sigma-delta modulator, the on/off-controls of the unit resistors constituting the variable resistors are performed. Here, for RG17p, RG17n, RF16p, RF16n, RF18p and RF18n as the variable resistors, the third variable resistance module, as with the embodiment 2, can be used.

As explained above, in this embodiment, according to the output signal of the decoder 6, which performs a code-conversion to the output of the third-order MASH sigma-delta modulator 1, the variable control of the variable resistors are performed. That is, the on/off-controls of the unit resistors constituting the input resistors RG17p and RG17n, the feedback resistors RF16p and RF16n, and the inter-stage feedback resistors RF18p and RF18n, are performed. By means of this, it is enabled to switch 2n-step cut-off frequencies by the n-bit digital code input CODE, and as a result, it is enabled to suppress the enlargement of the lay-out area for the circuit on an LSI together with the cost.

Also, the input resistors RG16p and RG16n are made to be variable resistors, and the on/off-controls of the unit resistor constituting the variable resistors, by using not the output of the sigma-delta modulator 1 but other code generating means, is performed. By means of this, in comparison with a configuration of the embodiment 3 (in which the sigma-delta modulator 1 is used), it is enabled to suppress the influence of the high-frequency noises of the sigma-delta modulator 1.

[Embodiment 6]

Figure 18:
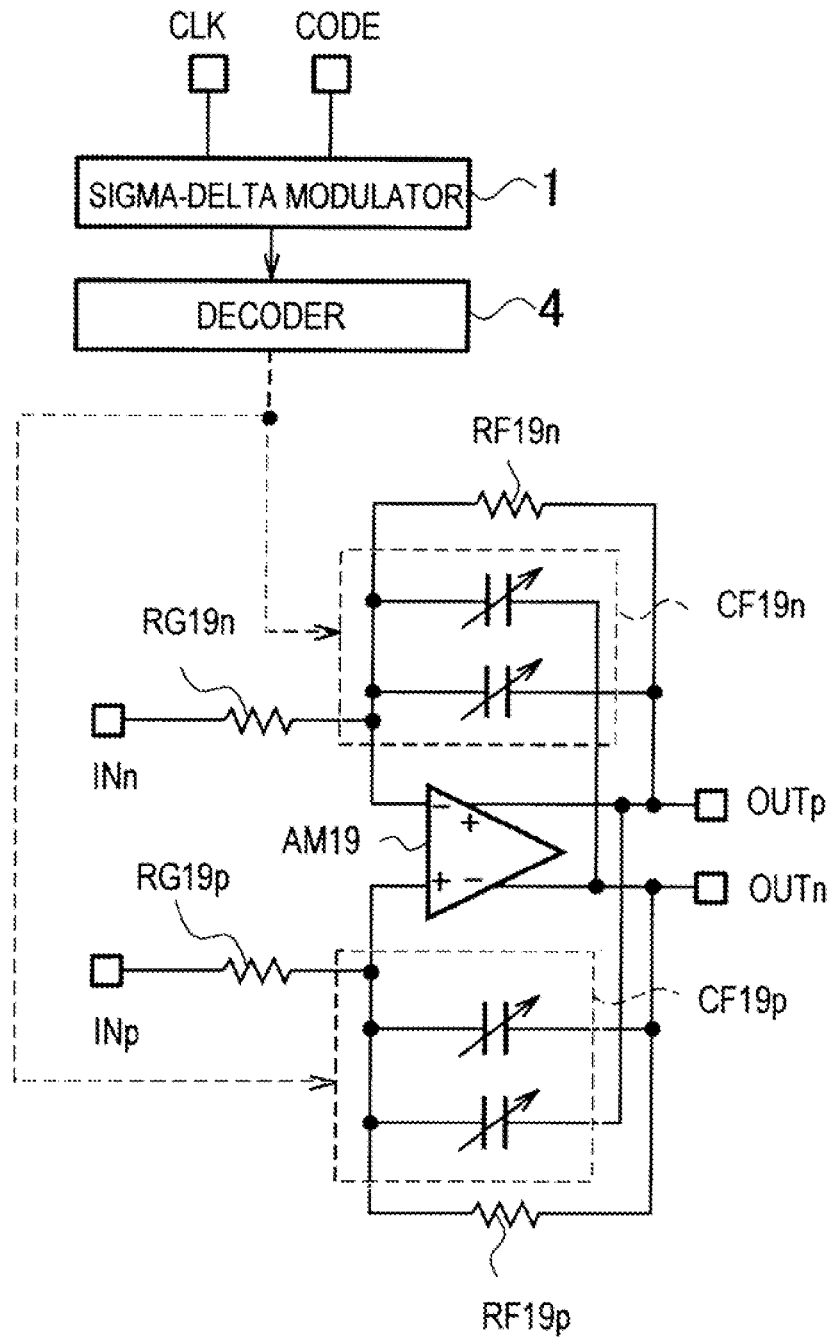
FIG. 18 illustrates an example of a fully-differential RC-LPF circuit.
Figure 19A:
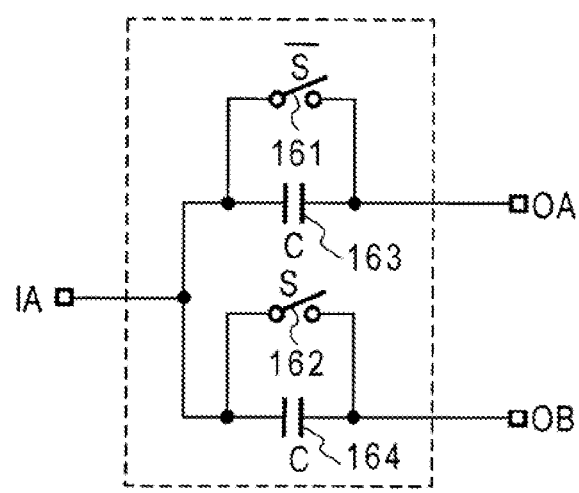
FIG. 19a, 19b illustrate examples of a variable resistance module.
Figure 19B:
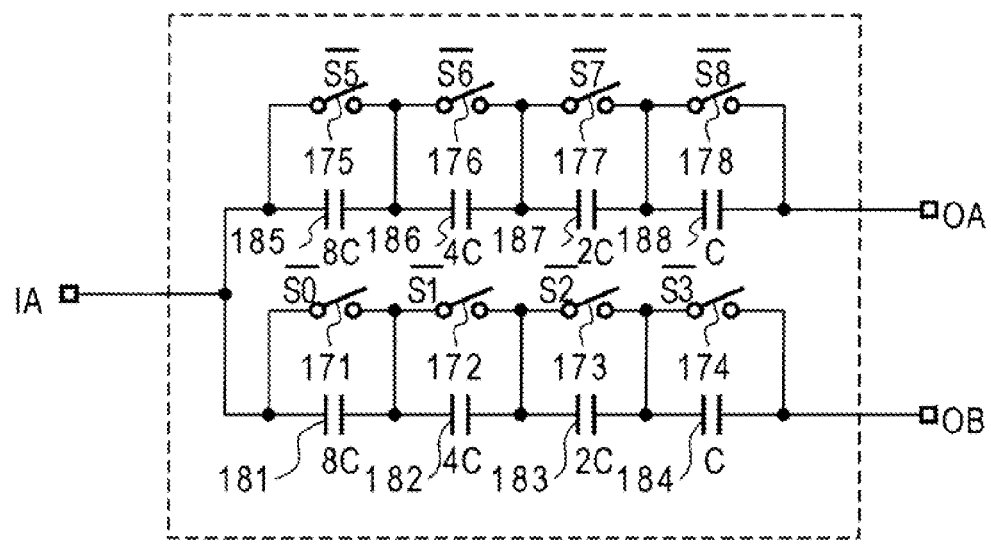

Next, by referring to FIG. 18 and FIG. 19, a basic configuration (No. 4), in which the present embodiment is applied to a fully-differential RC active filter (fully-differential RC-LPF circuit), is explained. In FIG. 18, a fully-differential RC-LPF circuit, to which the present embodiment is applied, is illustrated, and in FIGS. 19a and 19b, circuit diagrams of the variable capacitance modules are illustrated.

The filter circuit illustrated in FIG. 18 comprises the sigma-delta modulator 1, the decoder 4, and a fully-differential RC active-LPF circuit. The fully-differential RC active-LPF circuit comprises a fully-differential operational amplifier AM19, input resistors RG19p and RG19n, feedback resistors RF19p and RF19n, and feedback capacitors CF19p and CF19n. Here, the feedback capacitors CF19p and CF19n are variable capacitors and have the same circuit configuration.

Also, the feedback resistor RF19p is connected between the positive-polarity input terminal and the negative-polarity output terminal of the fully-differential operational amplifier AM19, and the feedback resistor RF19n is connected between the negative-polarity input terminal and the positive-polarity output terminal of the fully-differential operational amplifier AM19. Also, the input resistor RG19p is connected between the positive-polarity input terminal INp and the positive-polarity input terminal of the fully-differential operational amplifier AM19, and the input resistor RG19n is connected between the negative-polarity input terminal INn and the negative-polarity input terminal of the fully-differential operational amplifier AM19.

Also, capacitor cf1p between a first terminal and the same-polarity second terminal of the feedback capacitor CF19p is connected to between the positive-polarity input terminal and the negative-polarity output terminal of the fully-differential operational amplifier AM19. Also, capacitor cf2p between the first terminal and the reverse-polarity second terminal of the feedback capacitor CG19p is connected to between the positive-polarity input terminal and the positive-polarity output terminal of the fully-differential operational amplifier AM19. Also capacitor cf1n between a first terminal and the same-polarity second terminal of the feedback capacitor CF19n is connected to between the negative-polarity input terminal and the positive-polarity output terminal of the fully-differential operational amplifier AM19. Further, capacitor cf2n between the first terminal and the reverse-polarity second terminal of the feedback capacitor CF19n is connected to between the negative-polarity input terminal and the negative-polarity output terminal of the fully-differential operational amplifier AM19.

In the configuration of this filter circuit, the cut-off frequency is proportional to $1/(RF19x*CF19x)$, for x=p or x=n. Here, the feedback capacitors CF19p and CF19n are made to be variable capacitors, and, according to the output signal of the decoder 4, which performs a code-conversion to the output of the sigma-delta modulator 1, the on/off-controls of the unit capacitors constituting the variable capacitors are performed. By means of this, it is enabled to switch the multiple steps of cut-off frequencies.

Also, a circuit configuration of variable capacitance module, which is used as the variable capacitor, is illustrated in FIG. 19. The following first and second circuit configurations of the variable capacitance modules are considered to be as examples, which do not limit the scope of the present embodiment.

Firstly, the first variable capacitance module, as illustrated in FIG. 19A, comprises a first terminal IA, a same-polarity second terminal OA having the same-polarity as the first terminal IA, a reverse-polarity second terminal OB having the reverse-polarity, and a pair of internal capacitors 163 and 164. A terminal on one side of each of the internal capacitors 163 and 164 is connected to the first terminal IA, the other terminal of the internal capacitor 163 on one side is connected to the reverse-polarity second terminal OA, and the other terminal of the internal capacitor 164 on the other side is connected to the reverse-polarity second terminal OB. Also, an on/off-control signal for a switch 161 connected in parallel to the internal capacitor 164 is an inverted signal of an on/off-control signal for a switch 162 connected in parallel to the other internal capacitor 164.

Also, the second variable capacitance module, as illustrated in FIG. 19B, comprises a first terminal IA, a same-polarity second terminal OA having the same-polarity as the first terminal IA, a reverse-polarity terminal OB having the reverse polarity, and a pair of internal variable capacitor groups, each of which have the same number (four) of internal capacitors 181-184 and 185-188. In each of the internal variable capacitor groups, the internal capacitors 181-184 and the internal capacitors 185-188, which each constitute each of the variable capacitor groups, are each serially connected, and to each of the internal capacitors 181-188, dedicated switches 171-178 are each connected in parallel. Also, as for one of the variable capacitor groups, one terminal is connected to the first terminal IA, and the other terminal is connected to the same-polarity second terminal OA. Also, as for the other variable capacitor group, one terminal is connected to the second same-polarity terminal IA, and the other terminal of each of the variable capacitors is connected to the second reverse-polarity terminal OB. Here, on/off-control signals for the switches 175-178, which are connected in parallel to one internal variable capacitor group, are inverted signals of on/off-control signals for switches 171-174, which are connected in parallel to the other internal variable capacitor group.

The basic configuration (No. 4), in which the present embodiment illustrated in FIG. 18 is applied to fully-differential RC active filter (a fully-differential RC active-LPF circuit), can have a deploying configuration similarly to the first embodiment, that is, a configuration, in which, as the sigma-delta modulator 1, a third-order MASH sigma-delta modulator is used, and, in which, as the variable capacitor, the second variable capacitance module is used.

In this case, according to the output signal of the decoder 5, which performs a code-conversion to the output of the third-order MASH sigma-delta modulator 1, the on/off-controls of the variable capacitors, to be more specific, the unit capacitors constituting the feedback capacitors CF19p and CF19n, are performed. By means of this, it is enabled to switch 2n-step cut-off frequency by the n-bit digital code input CODE. Also, as a result of this, it is enabled to suppress the enlargement of the lay-out area for the circuit on an LSI, and, together with this, to suppress the cost.

Next, in order to examine the advantageous effect of cases in which the present embodiment is applied to a fully-differential RC active filter (the embodiments 1 to 6), a simulation experiment is performed. The simulation experiment is performed on the fully-differential biquad LPF circuit of the second embodiment, in other words, a deploying configuration, in which the present embodiment is applied to a fully-differential RC biquad LPF circuit (see FIG. 13). Also, to the fully-differential operational amplifier, an ideal model is applied.

Figure 20:
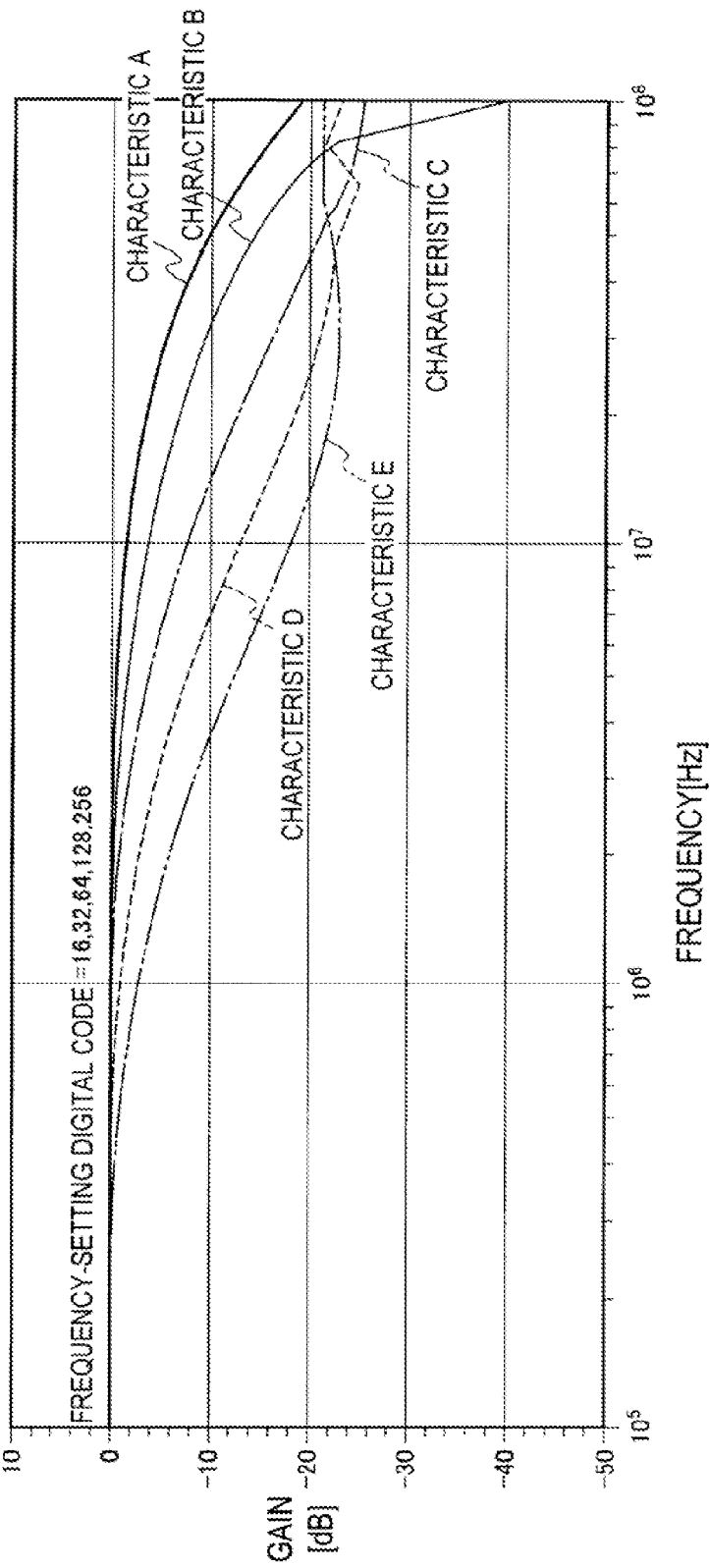
FIG. 20 illustrates an example of a frequency characteristic.

By using the third-order MASH sigma-delta modulator 1, the value H of n-bit (n=9) digital code input CODE is switched to 16, 32, 64, 128, and 256, and frequency characteristics illustrated in FIG. 20 are obtained. Each of the frequency characteristics for the digital code input CODE value H=16, 32, 64, 128, and 256 corresponds to, in FIG. 20, a characteristic A, a characteristic B, a characteristic C, a characteristic D, and a characteristic E.

In this application example, it is enabled to switch $2^n=512$-step cut-off frequencies by the n-bit digital code input CODE. From the experiment result, it is observed that, by switching the digital code input CODE value H from 16 to 256 in approximately 250 steps, switching the cut-off frequency in a range over the first digit (in FIG. 20, in an order of 106 Hz and the neighborhood thereof) is possible.

[Embodiment 7]

Figure 21A:
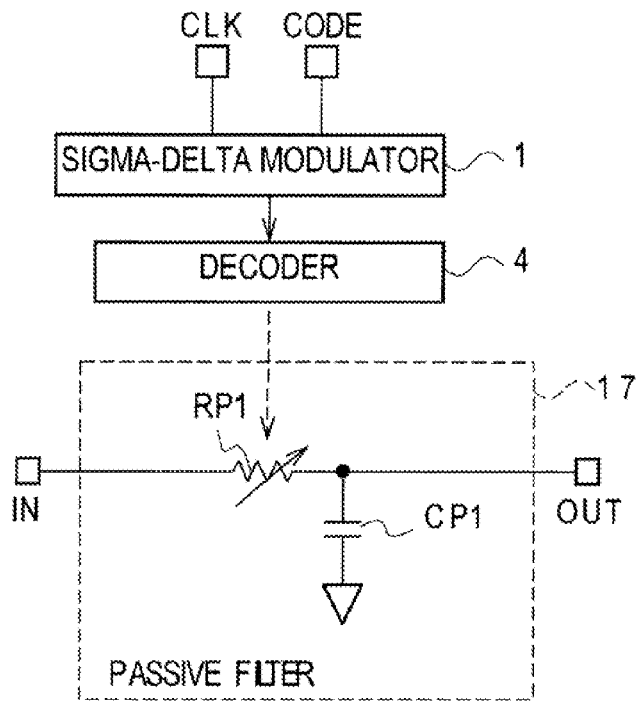
FIG. 21a, 21b illustrate examples of a passive filter circuit.
Figure 21B:
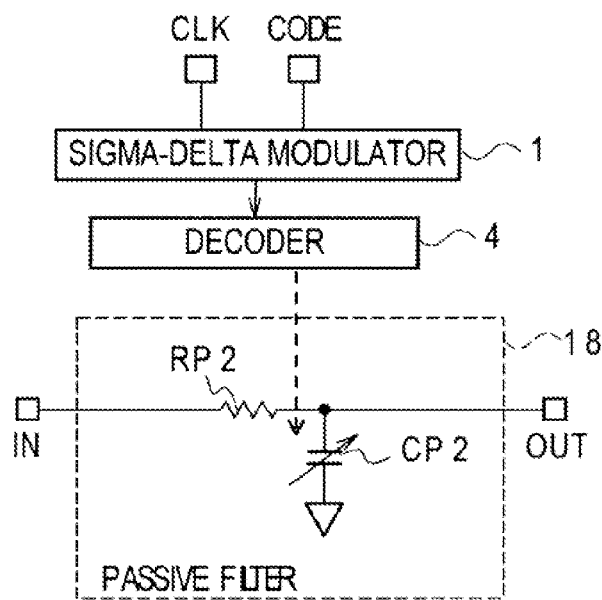

Next, by referring to FIG. 21, a basic configuration, in which the present embodiment is applied to a passive filter circuit, is explained. In FIG. 21A, a circuit diagram, in which resistances are variable, is illustrated, and in FIG. 21b, a circuit diagram, in which capacitances are variable, is illustrated.

First, a circuit configuration, with the resistances being variable, for switching the cut-off frequency of the passive filter circuit is illustrated. The filter circuit illustrated in FIG. 21A, comprises the sigma-delta modulator 1, the decoder 4, and a passive filter circuit 17. The passive filter circuit 17 is a first-order low-pass filter, and comprises a variable resistor RP1 and a capacitor CP1.

In the configuration of this filter circuit, since the cut-off frequency is proportional to $1/(RP1*CP1)$, by performing on/off-controls of unit resistors constituting the variable resistor RP1 according to the output signal of the decoder 4, which performs a code-conversion to the output of the sigma-delta modulator 1, it is enabled, by a low-bit digital code, to switch the multi-step cut-off frequencies.

Next, a circuit configuration, with the capacitors being variable, for switching the cut-off frequency of the passive filter circuit is illustrated. The filter circuit illustrated in FIG. 21B, comprises the sigma-delta modulator 1, the decoder 4, and a passive filter circuit 18. The passive filter circuit 18 is a first-order low-pass filter, and comprises a resistance RP2 and a variable capacitor CP2.

In the configuration of this filter circuit, since the cut-off frequency is proportional to $1/(RP2*CP2)$, by performing on/off-controls of unit capacitors constituting the variable capacitor CP2 according to the output signal of the decoder 4, which performs a code-conversion to the output of the sigma-delta modulator 1, it is enabled, by a low-bit digital code, to switch multi-step cut-off frequencies.

[Embodiment 8]

Figure 22:
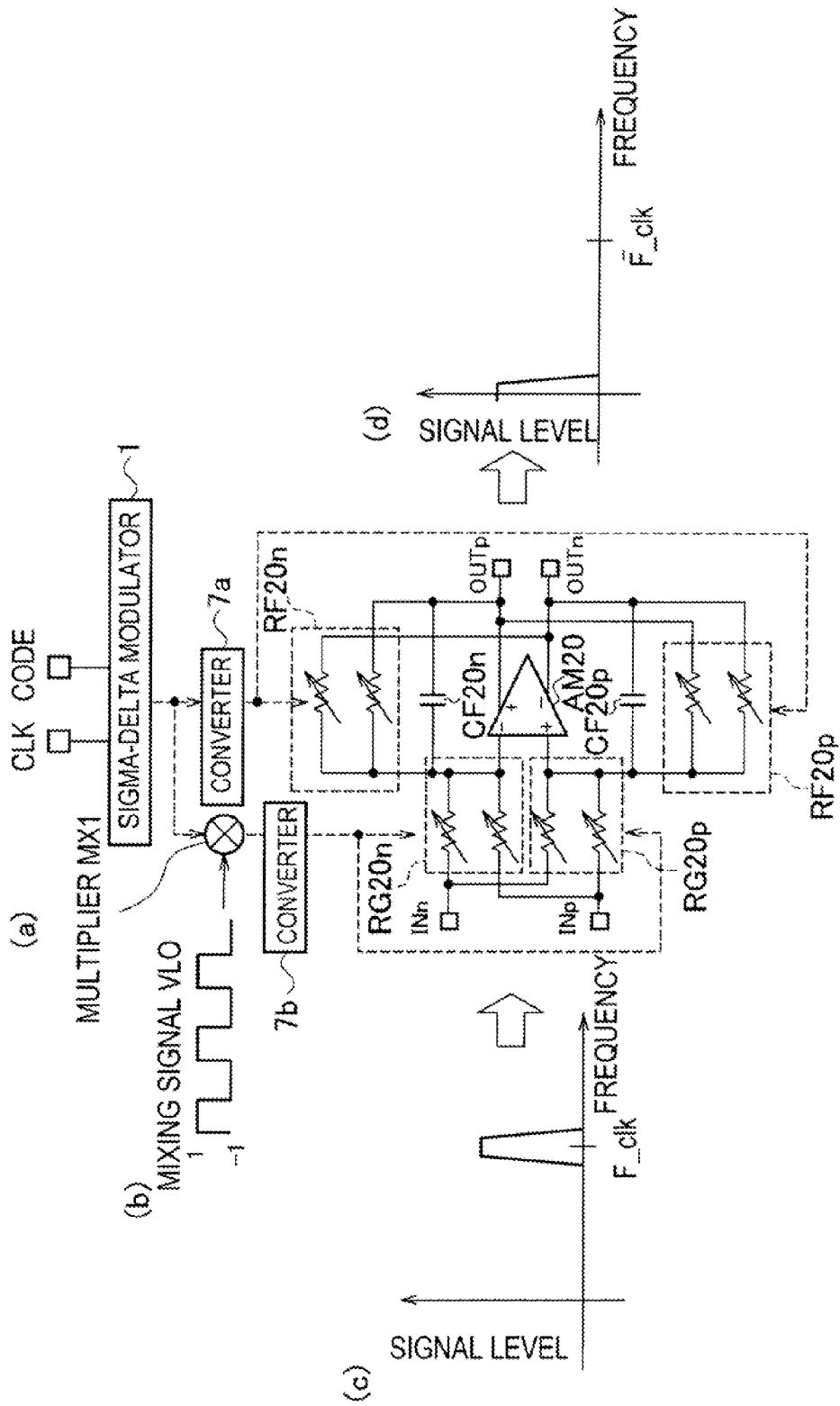
FIG. 22 illustrates an example of a filter circuit with a mixer function.

Next, by referring to FIG. 22 and FIG. 23, a filter circuit, which comprises the filter circuit of the first embodiment (in other words, the basic configuration, in which the present embodiment is applied to a fully-differential RC active-LPF circuit (see FIG. 5)) and an mixer function, is explained. In FIG. 22(*a*), a fully-differential RC active-LPF circuit of this embodiment is illustrated. And in FIG. 23, an ordinary radio-communication receiver circuit, to which a fully-differential RC active-LPF circuit of the this embodiment is applied, is illustrated.

The filter circuit illustrated in FIG. 22(*a*) comprises the sigma-delta modulator 1, a multiplier MX1, decoders (converters) 7*a* and 7*b*, and a fully-differential RC active-LPF circuit. The fully-differential RC active-LPF circuit comprises a fully-differential operational amplifier AM20, input resistors RG20*p* and RG20*n*, feedback resistors RF20*p* and RF20*n*, and feedback capacitors CF20*p* and CF20*n*, and has a configuration equivalent to FIG. 7. Here, in FIG. 22, the configuration of the sigma-delta modulator 1 is not specified, however, for example, a third-order MASH sigma-delta modulator, which is equivalent to that of the first embodiment, can be used.

Also, in this embodiment, in the fully-differential RC active-LPF circuit, the input resistors RG20*p* and RG20*n* and the feedback resistors RF20*p* and RF20*n* are made to be variable resistors. Here, as for the feedback resistors RF20*p* and RF20*n*, according to the output signal of the decoder 7*a*, which performs a code-conversion to the output of the sigma-delta modulator 1, the on/off-controls of the unit resistors, which constitute the variable resistors, are performed. Also, as for the input resistors RG20*p* and RG20*n*, the decoder 7*b* performs a code-conversion to the output signal of the sigma-delta modulator 1, which has been performed a frequency-conversion by the multiplier MX1, and, according to the output signal of the decoder 7*a*, the on/off-controls of the unit resistors, which constitute the variable resistors, are performed. Here, as the variable resistor, either of the first or the second variable resistance module illustrated in FIG. 6 can be used.

Here, the frequency conversion function of the multiplier MX1 is explained. As described in FIG. 6.15 (page 181) of "RF MICROELECTRONICS", by switching inversion/non-inversion of the input signal according to a signal of a certain frequency (LO), it is enabled to operate the frequency conversion (mixing) operation. In FIG. 22(*a*), by the multiplier MX1, to the output of the sigma-delta modulator 1, a mixing signal VLO, which repeats inversion/non-inversion at a certain frequency, is multiplied.

By means of this, a filter input having a signal level at a frequency F_cl, as illustrated by a frequency characteristic of the signal level in FIG. 22(*c*), is changed through a filtering to a filter output having the signal level at a shifted frequency, as illustrated by a frequency characteristic of the signal level in FIG. 22(*d*). By means of this, a frequency-conversion function can be added to a filter circuit which has variable cut-off frequency.

In the configuration of this filter circuit, the cut-off frequency is proportional to $1/(RF20x*CF20x)$, for x=p or x=n. Here, the feedback resistors RF20*p* and RF20*n* are made to be variable resistors, and, according to the output signal of the decoder 7*a*, which performs a code-conversion to the output of the sigma-delta modulator 1, the on/off-controls of the unit resistors constituting the variable resistors are performed. By means of this, it is enabled to switch the multi-step cut-off frequencies by a low bit digital code.

Also, as for the gain, which is proportional to $(RF15x/CF15x)$, for x=p" or x=n, the input resistors RG20*p* and RG20*n* are made to be variable resistors, and, by using, not the output signal of the sigma-delta modulator 1, but another code generating means, the on/off-controls of the unit resistors constituting the variable resistors are performed. By means of this, in comparison with the configuration of the first embodiment, in which the sigma-delta modulator 1 is used, it is enabled, as for the gain characteristic, to suppress the influence of high-frequency noises of the sigma-delta modulator 1.

Next, a configuration of an ordinary radio-communication receiver circuit, to which a fully-differential RC active-LPF circuit of this embodiment is applied, is briefly illustrated. The radio receiver circuit illustrated in FIG. 23 comprises an antenna 201, a low-noise amplifier (LNA) 202, mixers (MIX) 203 and 204, a shifter (SFT) 205, a local oscillator (VCO) 206, low-pass filters (LPF) 207 and 208, and variable gain amplifiers (VGA) 209 and 210.

At the low-noise amplifier (LNA) 202, the RF signal received by the antenna 201 is amplified so that even a weak signal is amplified without being buried in the noise, and, so that a strong signal is amplified without being distorted. Also, at the mixers (MIX) 203 and 204, according to a local signal, which is a local oscillator frequency signal of the local oscillator 206 shifted by the shifter 205, RF signals among the output of the low-noise amplifier 202 are converted into intermediate frequency signals. And, at the low-pass filters 207 and 208, channels to be received are selected. Further, at the variable gain amplifier 209 and 210, a signal is amplified to a level at which decoding is possible.

The fully-differential RC active-LPF circuit of this embodiment is applied to the low-pass filters 207 and 208. By this application, in the radio-communication receiver circuit, even if switching the cut-off frequencies of low-pass filters 207 and 208 by a narrow step in a wide range is required, it is enabled, by a smaller number of unit elements, to vary the elements, i.g. feedback resistors, which determine the filter characteristics, and it is enabled to suppress the enlargement of the lay-out area for the circuit on an LSI, and, together with this, to suppress the cost.

[Embodiment 9]

Figure 24:
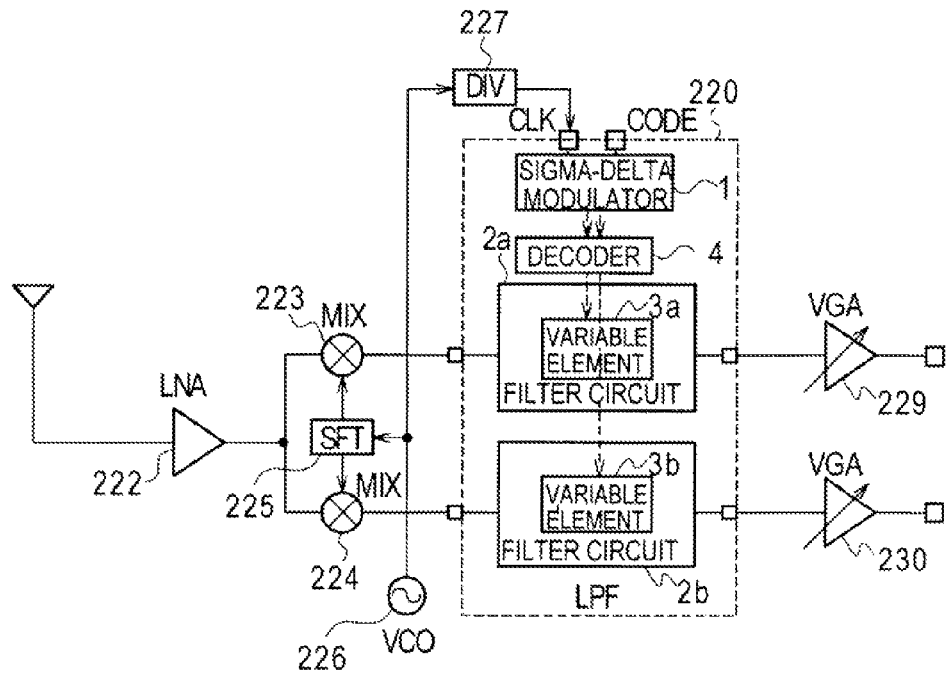
FIG. 24 illustrates an example of a radio receiver circuit.

Next, by referring to FIG. 24, a configuration, in which a filter circuit of the present embodiment is applied to a radio receiver circuit, is explained. In FIG. 24, a radio receiver circuit of this embodiment is illustrated.

The radio receiver circuit illustrated in FIG. 24, comprises an antenna, a low-noise amplifier (LNA) 222, mixers (MIX) 223 and 224, a shifter (SFT) 225, a local oscillator (VCO) 226, low-pass filters (LPF) 227 and 228, variable gain amplifiers (VGA) 229 and 230, and a divider (DIV) 227.

Here, the low-pass filter (LPF) 220 comprises the sigma-delta modulator 1, the decoder 4, and filter (LPF) circuits 2*a* and 2*b*. Here, the filter (LPF) circuits 2*a* and 2*b* have variable elements 3*a* and 3*b*, which determine the filter characteristics (cut-off frequencies) of the filter (LPF) circuits 2*a* and 2*b*. The filter (LPF) circuits 2*a* and 2*b* can be any configuration of the above described embodiments 1 to 7 or variations thereof. The variable elements 3*a* and 3*b* are resistors or capacitors.

As the operation clock for operating the sigma-delta modulator 1, a local oscillator frequency signal, which is the output of the local oscillator (VCO) 226, is used. More specifically, a local-oscillator frequency signal, which is divided by the divider (DIV) 227 according to a prescribed dividing ratio, is used. Here, the local-oscillator frequency signal, which is an output of the local oscillator (VCO) 226, can be used as the operation clock CLK as is (without being through the divider (DIV) 227).

Also, a configuration is possible, such that, as the operation clock CLK for operating the sigma-delta modulator 1, local signals used by the mixers (MIX) 223 or 224, that are the local-oscillator frequency signal of the local oscillator 226 divided by the shifter 225, are used.

Also, the n-bit digital code input CODE is provided by a filter characteristic (a cut-off frequency) setting means, which is not illustrated.

By the above application of filter circuit of the present embodiment to the radio receiver circuit, even if switching the cut-off frequency of the low-pass filter 220 by a narrow step in a wide range is required, it is enabled, by a smaller number of unit elements, to vary the elements, i.g. feedback resistors, which determine the filter characteristic, and it is enabled to suppress the enlargement of the lay-out area for the circuit on an LSI, and, together with this, to suppress the cost.

[Embodiment 10]

Figure 25:
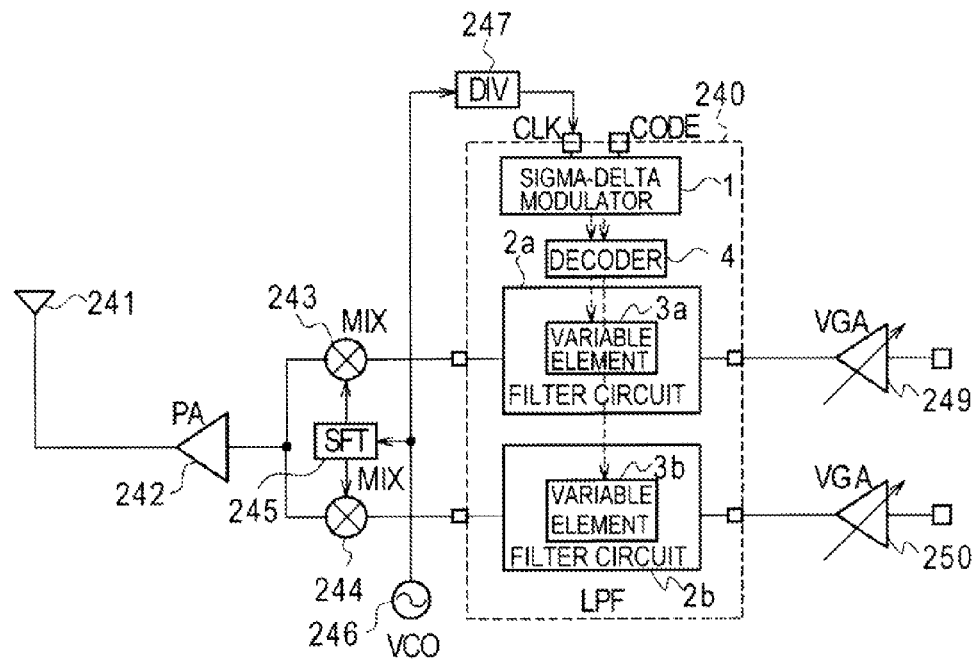
FIG. 25 illustrates an example of a radio transmitter circuit.

Next, by referring to FIG. 25, a configuration, in which a filter circuit of the present embodiment is applied to a radio-communication transmitter circuit, is explained. In FIG. 25, a radio transmitter circuit of this embodiment is illustrated.

The radio transmitter circuit illustrated in FIG. 25, comprises an antenna 241, a power amplifier (PA) 242, mixers (MIX) 243 and 244, a shifter (SFT) 245, a local oscillator (VCO) 246, a low-pass filter (LPF) 240, variable gain amplifiers (VGA) 249 and 250, and a divider (DIV) 247.

Here, the low-pass filter (LPF) 240 comprises the sigma-delta modulator 1, the decoder 4, and the filter (LPF) circuits 2a and 2b. Here, the filter (LPF) circuits 2a and 2b have variable elements 3a and 3b, which determine the filter characteristics (cut-off frequencies) of the filter (LPF) circuits 2a and 2b. The filter (LPF) circuits 2a and 2b can be any configuration of the above described embodiments 1 to 7 or the variations thereof. The variable elements 3a and 3b are resistors or capacitors.

As the operation clock for operating the sigma-delta modulator 1, a local oscillator frequency signal, which is the output of the local oscillator (VCO) 246, is used. More specifically, the local-oscillator frequency signal, which is divided by the divider (DIV) 247 according to a prescribed dividing ratio, is used. Here, the local oscillator frequency signal, which is an output of the local oscillator (VCO) 246, can be used as the operation clock CLK as is (without being through by the divider (DIV) 247).

Also, a configuration is possible, such that, as the operation clock CLK to operate the sigma-delta modulator 1, local signals used by the mixers (MIX) 243 or 244, which are local-oscillator frequency signals of the local oscillator 246 divided by the shifter 245 are used.

Also, the n-bit digital code input CODE is provided by a filter characteristic (a cut-off frequency) setting means which is not illustrated.

By an application as above of filter circuit of the present embodiment to the radio receiver circuit, even if it is required to switch the cut-off frequency of low-pass filter 240 by a narrow step in a wide range, it is enabled, by a smaller number of unit elements, to vary the elements (feedback resistors) which determine the filter characteristic, and it is possible to suppress the enlargement of the lay-out area for the circuit on an LSI and, together with this, to suppress the cost.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has been described in detail, it should be understood that the various changes, substitutions, and alterations could be made hereto without departing from the spirit and scope of the invention.

The invention claimed is:

1. A filter comprising:
   a sigma-delta modulator configured to sigma-delta modulate an input signal corresponding to a desired cut-off frequency to output a modulated signal; and
   a fully-differential active filter including,
      a differential amplifier having a positive-polarity input terminal, a negative-polarity input terminal, a positive-polarity output terminal and a negative-polarity output terminal, and configured to amplify an input differential signal being input to the positive-polarity input terminal and the negative-polarity input terminal to output an amplified output differential signal from the positive-polarity output terminal and the negative-polarity output terminal,
      a first variable resistor or a first variable capacitor provided between the positive-polarity output terminal and the positive-polarity input terminal,
      a second variable resistor or a second variable capacitor provided between the positive-polarity output terminal and the negative-polarity input terminal,
      a third variable resistor or a third variable capacitor provided between the negative-polarity output terminal and the negative-polarity input terminal, and
      a fourth variable resistor or a fourth variable capacitor provided between the negative-polarity output terminal and the positive-polarity input terminal,
      values of the first to fourth variable resistors or the first to fourth variable capacitors being set in accordance with the modulated signal output from the sigma-delta modulator so that the fully-differential active filter has the desired cut-off frequency.

2. The filter according to claim 1, wherein the fully-differential active filter has a gain.

3. The filter according to claim 1, wherein the fully-differential active filter includes a second resistor which determines a gain but not the cut-off frequency, and
   a resistance value of the second resistor is varied.

4. The filter according to claim 3, further comprising a multiplier which multiplies, to an output of the sigma-delta modulator, a polarity-invert signal, of which a polarity inverts according to a prescribed frequency, wherein
   the resistance value of the second resistor is varied, according to an output of the multiplier, or according to a converted signal through a converter which performs a code-conversion to an output of the multiplier.

5. The filter according to claim 1; wherein
   the first and fourth variable resistors and the second and third variable resistors respectively have a resistor unit having a first terminal, a same-polarity second terminal of the same polarity as the first terminal, a reverse-polarity second terminal of the reverse polarity to the first terminal, and first and second internal resistors; wherein
   one terminal of each of the first and second internal resistors is connected via a switch to the first terminal,
   the other terminal of the first internal resistor is connected to the same-polarity second terminal, and the other terminal of the second internal resistor is connected to the reverse-polarity second terminal; and wherein an on/off-control signal for the switch connected to the first internal resistors is an inverted signal of an on/off-control signal for the switch connected to the second internal resistors, the on/off-control signal including the output of the sigma-delta modulator or the converted signal.

6. The filter according to claim 1; wherein the first and fourth variable resistors and the second and third variable resistors respectively have a resistor unit having a first terminal, a same-polarity second terminal of the same polarity as the first terminal, a reverse-polarity second terminal of the reverse polarity to the first terminal, and first and second internal resistor groups, which have the same number of internal resistors; wherein one terminal of each internal resistor, within the first and second internal resistor groups, is connected via a switch to the first terminal, the other terminal of each internal resistor, within the first internal resistor groups, is connected to the same-polarity second terminal, and the other terminal of each internal resistor, within the second internal resistor groups, is connected to the reverse-polarity second terminal; and wherein one of a plurality of the switches is switched on.

7. The filter according to claim 1; wherein the first and second variable resistors and the third and fourth variable resistors respectively have a resistor unit having a first terminal, a same-polarity second terminal of the same polarity as the first terminal, and a reverse-polarity second terminal of the reverse polarity to the first terminal; wherein the resistor comprises 2*n+1 (n being a positive integer) internal resistors; wherein each of the internal resistors has a resistance value R, one terminal of each of the internal resistors is connected to the first terminal, the other terminal of each of the internal resistors is connected to the same-polarity second terminal via a first switch which is on/off-controlled by a first control signal, the other terminal of each of the internal resistors is connected to the reverse-polarity second terminal via a second switch being on/off-controlled by a second control signal, which is an inverted signal of the first control signal; and wherein each of the internal resistors is on/off-controlled by the first or the second control signal which is independent for the each of the internal resistors.

8. A transmitter comprising:

a mixer circuit; and the filter of claim 1, wherein the sigma-delta modulator operates in synchronous to a clock generated by a local oscillator or a divided clock of the clock generated by the local oscillator.

9. A receiver comprising a mixer circuit; and the filter of claim 1, wherein the sigma-delta modulator operates in synchronous to a clock generated by a local oscillator or a divided clock of the clock generated by the local oscillator.

10. A transmitter comprising:

a mixer circuit; and the filter of claim 1, wherein the sigma-delta modulator operates in synchronous to a local clock of the mixer circuit or a divided local clock of the local clock of the mixer circuit.

11. A receiver comprising:

a mixer circuit; and the filter of claim 1, wherein the sigma-delta modulator operates in synchronous to a local clock of the mixer circuit or a divided local clock of the local clock of the mixer circuit.

12. A filter according to claim 1; wherein the cut-off frequency is controlled to shift a positive side based on first values of the first to fourth variable resistors or the first to fourth variable capacitors when the sigma-delta modulator output a first modulation signal, and is controlled to shift a negative side based on second values of the first to fourth variable resistors or the first to fourth variable capacitors when the sigma-delta modulator output a second modulation signal.

* * * * *